United States Patent
Bae et al.

(10) Patent No.: US 6,730,956 B2
(45) Date of Patent: May 4, 2004

(54) METHOD FOR MANUFACTURING THE STORAGE NODE OF A CAPACITOR OF A SEMICONDUCTOR DEVICE AND A STORAGE NODE MANUFACTURED BY THE METHOD

(75) Inventors: Dong-il Bae, Seoul (KR); Dong-won Shin, Sungnam (KR); Sang-hyeon Lee, Suwon (KR)

(73) Assignee: Samsung Electronics Co., Ltd., Kyongki-Do (KR)

( * ) Notice: Subject to any disclaimer, the term of this patent is extended or adjusted under 35 U.S.C. 154(b) by 0 days.

(21) Appl. No.: 10/329,488

(22) Filed: Dec. 27, 2002

(65) Prior Publication Data

US 2003/0215983 A1 Nov. 20, 2003

(30) Foreign Application Priority Data

May 16, 2002 (KR) .......................... 2002-27114

(51) Int. Cl.$^7$ .................... H01L 27/108; H01L 21/8242
(52) U.S. Cl. .................. 257/306; 438/253; 438/254; 438/396
(58) Field of Search .................... 438/253–256, 438/396–399; 257/296, 306, 307–309, 311

(56) References Cited

U.S. PATENT DOCUMENTS

| 5,763,286 | A | * | 6/1998 | Figura et al. | ............... 438/255 |
| 6,180,452 | B1 | * | 1/2001 | Figura | ............... 438/255 |
| 6,359,301 | B1 | * | 3/2002 | Kuroda | ............... 257/306 |
| 6,500,763 | B2 | * | 12/2002 | Kim et al. | ............... 438/689 |
| 6,501,119 | B1 | * | 12/2002 | Ohno | ............... 257/306 |
| 2002/0140018 | A1 | * | 10/2002 | Lee et al. | ............... 257/306 |

* cited by examiner

Primary Examiner—T. N. Quach
(74) Attorney, Agent, or Firm—Harness, Dickey

(57) ABSTRACT

Methods for manufacturing a storage node of a capacitor of a semiconductor device and a storage node manufactured by these methods are provided. An exemplary method for manufacturing a storage node of a capacitor of a semiconductor device includes forming a mold layer on a semiconductor substrate, forming a mold for the storage node by patterning the mold layer by a photolithography process, introducing a photomask which includes a plurality of light transmitting patterns separated from each other and which define the region to be occupied by the storage node, and forming a storage node that has the shape formed by the mold. The photolithography process is performed with the occurrence of a pattern bridge phenomenon, e.g., the transferred light transmitting patterns are connected to each other in a pattern transferred from the light transmitting patterns to the mold.

61 Claims, 27 Drawing Sheets

METHOD FOR MANUFACTURING THE STORAGE NODE OF A CAPACITOR OF A SEMICONDUCTOR DEVICE AND A STORAGE NODE MANUFACTURED BY THE METHOD

CROSS-REFERENCE TO RELATED APPLICATIONS

This non-provisional application claims priority under 35 U.S.C. §119 to Korean Patent Application No. 2002-27114 filed May 16, 2002, the contents of which are incorporated herein by reference in its entirety.

BACKGROUND OF THE INVENTION

1. Field of the Invention

The present invention relates generally to a semiconductor device, and more particularly, to a method for manufacturing the storage node of a capacitor which is capable of increasing effective surface.

2. Description of the Related Art

As the integration of semiconductor devices such as dynamic random access memory (DRAM) devices increases, the fineness of patterns and a reduction of the design rule must be enforced. However, a reduction of the design rule creates difficulties in obtaining various semiconductor characteristics such as those of a transistor, cell capacitor, and wiring resistance.

Semiconductor devices require a certain cell capacitance depending on their particular characteristics. Typically, more than 30 pF capacitance per cell is required in a DRAM, taking into consideration the various coupling capacitance, leakage current, loss of electric charge due to an alpha particle during packing, and refreshing time. Accordingly, the reduction of the design rule has generated, numerous suggested methods for obtaining the required capacitance.

To obtain the required cell capacitance, two methods of using a dielectric layer, i.e., 1. using a dielectric constant which is relatively high, and 2. increasing the area of a capacitor, can be considered. However, it is widely known that these two methods present problems relating to the step coverage of a dielectric layer, leakage current, and reliability in using a new dielectric layer with a considerably high dielectric constant. As a result, studies on how to obtain sufficient capacitance to overcome the reduction of capacitance due to the reduction of the design rule have focused on methods for structurally securing the effective areas of a capacitor. One study relates to a method for increasing the effective surface area of a storage node by giving the storage node a three-dimensional shape, such as cylinder stack shape. FIG. 1 is a schematic cross-sectional view illustrating a storage node 60 in the shape of a cylinder stack. Storage node 60 is electrically connected to a semiconductor substrate 10 between gate patterns 23 and 25 of the cell transistor formed on the active regions determined by an isolation region 15. A gate oxide layer 21 can be interpositioned between the gate patterns 23 and 25 and the semiconductor substrate 10. An electric connection is achieved by placing a conductive plug 35 through the insulating interlayer 40 and by placing a conductive pad 31 under the conductive plug 35. Insulation between the conductive pad 31 and the gate patterns 23 and 25 is achieved by the capping layer 27 and spacer 29.

As shown in FIG. 1, the cylindrical storage node 60 is connected to the lower conductive plug 35. A mold layer (not shown in FIG. 1) is introduced to give the storage node 60 a cylindrical shape. The positioning of the storage node 60 is determined by patterning the mold layer. The storage node layer is then arranged with the patterns of the mold layer and is separated into individual storage nodes 60 by cells.

FIG. 2 is a schematic cross-sectional view illustrating the mold layer 70 which is introduced to form the storage node 60 into a cylindrical shape. Referring to FIG. 2, the mold layer 70 is formed to cover the insulating interlayer 40 and to have a thickness equivalent to the height of (i.e., co-planer to) the storage node 60 illustrated in FIG. 1. A supporter layer 50 may be introduced between the mold layer 70 and the insulating interlayer 40. The supporter layer 50 supports the storage node 60 shown in FIG. 1, and further includes an etch stopper (not shown) for stopping the etching during the etch process for patterning the mold layer 70.

The mold layer 70 is patterned by a photolithography process to have an opening 75 that exposes the lower conductive plug 35. The region where the opening 75 is formed becomes the region where the storage node 60 is located. However, the region to be occupied by the storage node 60 may be formed in a slightly different shape from the region designed by the photo mask layout. FIG. 3 is a schematic view illustrating the photo mask layout for opening 75 shown in FIG. 2. FIG. 4 is an illustration of the actual shape of the opening 75. FIG. 5 is an illustration of the shape of the storage node 60 that occupies the opening 75. FIG. 6 is an illustration of the shape of a storage node 65 that is intended to be formed by the opening 75.

The storage node region 71 has a substantially rectangular shape, as is shown in FIG. 3. The storage node region 71, designed to have a rectangular shape for the opening 75, has a rectangular shape that extends in the direction of a bit line (not shown). After a photolithography process has been performed, the storage node region 71 has a substantially elliptical shape, such as the shape of the opening 75 shown in FIG. 4. Thus, the photolithography process rounds the edge of the storage node region 71 on the mask layout. As a result, a cross-section of the storage node 60 of FIG. 1 and FIG. 5, which is deposited and separated along with the mold layer 70 of FIG. 2, does not have the designed rectangular shape. Instead, the cross-section of storage node 60 has a shape that is substantially elliptical.

The area occupied by the substantially elliptical storage node 60 or the area of the substantially elliptical opening 75 is less than the area of the designed (i.e., rectangular) for the storage node region 71. Accordingly, the effective surface area of the storage node 60 is also less than that of the original design. Thus, the formed storage node 60 (i.e., elliptical shape) occupies an area less than that of the originally designed storage node 65 shown in FIG. 6 (i.e., a rectangular shape).

To compensate for the loss of area, the process for forming the storage node 60 is performed so that the storage node 60 is extended to its maximum length along its axes. In particular, the length of the long axis is about 424 nm and the length of the short axis is about 75 nm. However, the extension of the storage node 60 may be limited by the lengths of the long axis, the short axis, and the cell pitch. To obtain more capacitance in a limited cell pitch, it is necessary to increase the height of the storage node 60, but this is limited structurally by the photolithography process introduced to form the storage node 60.

More specifically, if the height of the storage node 60 is increased, the probability of a hard fail, (e.g., a twin-bit fail,)

increases due to the bridges between neighboring capacitors. If For example, if a storage node structure in the shape of a cylinder stack is used, electric shorts occurring between neighboring cell capacitors in a semiconductor device cause twin-bit fails.

The storage node in the shape of a cylinder stack presents a weak force for supporting the structure against external forces. Further, it is possible that bridges occur between the storage nodes if a sufficient distance between the storage nodes is not obtained due to items such as changes in the stress of the lower layers supporting the storage node or changes in the node itself. Accordingly, bridges formed between storage nodes may prevent an increase in the effective surfaces of a capacitor.

SUMMARY OF THE INVENTION

At least one exemplary embodiment of the present invention provides a method for manufacturing the storage node of the capacitor of a semiconductor device which can reduce the occurrence of pattern bridges between the storage nodes of a cell capacitor and in increasing the capacitance of the capacitor.

At least one exemplary embodiment of the present invention provides a method for manufacturing the storage node of a capacitor of a semiconductor device.

At least one exemplary embodiment of the present invention provides a method for manufacturing a storage node of a capacitor of a semiconductor device that includes forming a mold layer on a semiconductor substrate; forming a mold frame for the storage node by introducing a photomask having an array of a light transmitting patterns that are separated from each other, the light transmitting patterns defining the region to be occupied by the storage node; forming a storage node having the shape of the mold frame; and patterning the mold layer by a photolithography process with the photomask.

In at least one exemplary embodiment of the present invention, the light transmitting patterns are arranged around the contour of the substantially rectangular region to be occupied by the storage node of the capacitor. The light transmitting patterns are separated from each other by light shielding patterns. The light transmitting patterns may have the same shapes and sizes or they may have shapes and sizes that are different from each other. The photolithography process is performed with pattern bridges occurring between transferred light transmitting patterns that are to be connected to each other in a pattern transmitted to the mold.

In one or more exemplary embodiments of the present invention, the mold has rectangular opening to be occupied by the storage node. The mold for the storage node may have an indented sidewall surface that includes an opening for the region to be occupied by the storage node. The storage node can have an indented cylinder sidewall due to the indents in the sidewall surface of the mold for the storage node.

At least one other exemplary embodiment of the present invention provides a method for manufacturing the storage node of a capacitor of a semiconductor device that includes forming a mold layer for the storage node on a semiconductor substrate; forming a photoresist layer on the mold layer for the storage node; introducing a photomask having a plurality of light transmitting patterns separated from each other and arranged around the region to be occupied by the storage node of the capacitor; forming a photoresist pattern from the photoresist layer by a photolithography process with the photomask, the photolithography process being performed with pattern bridges occurring between transferred light transmitting patterns to be connected to each other in a pattern transferred from the photomask to the photoresist layer; forming a mold for the storage node by patterning the mold layer with an etching process using the photoresist pattern as an etching mask; and forming the storage node. The photoresist pattern can have an intended sidewall due to the pattern bridges.

In at least one exemplary embodiment of the present invention, the method for manufacturing the storage node of a capacitor of a semiconductor device includes forming a groove for a hard mask mold on the surface of the mold layer by etching an exposed mold layer portion using the photoresist pattern as an etching mask and forming a hard mask for filling the groove for the hard mask frame. In at least one other exemplary embodiment of the present invention, the hard mask is used as an etching mask to form the frame for the storage node. In particular, forming the hard mask includes forming a hard mask layer for filling the groove and planarizing the hard mask layer until the upper surface of the mold layer for the storage node is exposed. The hard mask can have a sidewall curved by the pattern bridges. The hard mask can be formed of silicon nitride ($Si_3N_4$) or polycrystalline silicon.

At least one other exemplary embodiment of the present invention provides a method for manufacturing a storage node of a capacitor for a semiconductor device that includes forming a mold layer for the storage node on a semiconductor substrate; forming a photoresist layer on the mold layer; forming a photoresist pattern by transferring the shapes of the light transmitting patterns on the photoresist layer by introducing a photomask on which a plurality of light transmitting patterns separated from each other are arranged around the region to be occupied by the storage node; forming a mold for the storage node by patterning the mold layer so that the shapes of the light transmitting patterns are transferred to the mold layer for the storage node, wherein pattern bridges occur between the light transmitting patterns during the etching process; and forming a storage node that has the shape of the mold.

In at least one exemplary embodiment of the present invention, forming the frame for the storage node includes forming a groove for the hard mask on the surface of the mold layer by etching the exposed mold layer portion so that the shapes of the light transmitting patterns are transferred to the mold layer portion, wherein pattern bridges that occurr between the light transmitting patterns during the etching process use the photoresist pattern as an etching mask; forming a hard mask for filling the groove; and forming the mold for the storage node using the hard mask as an etching mask.

In at least one exemplary embodiment of the present invention, forming the groove for the hard mask includes dry-etching the portion of the mold layer for the storage node exposed by the photoresist pattern and performing an additional wet-etching to create the pattern bridges. The hard mask has a sidewall curved by the pattern bridges.

At least one exemplary embodiment of the present invention provides a storage node of a capacitor of a semiconductor device in which the storage node of the capacitor has a curved cylindrical sidewall protruded against the ground. The indented shape extends over the sidewall of the cylinder in the protruding direction.

According to at least one exemplary embodiment the present invention, the occurrence of bridges between storage nodes when the storage node of a cell capacitor is formed may be reduced, and the volume of a capacitor may be effectively increased.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
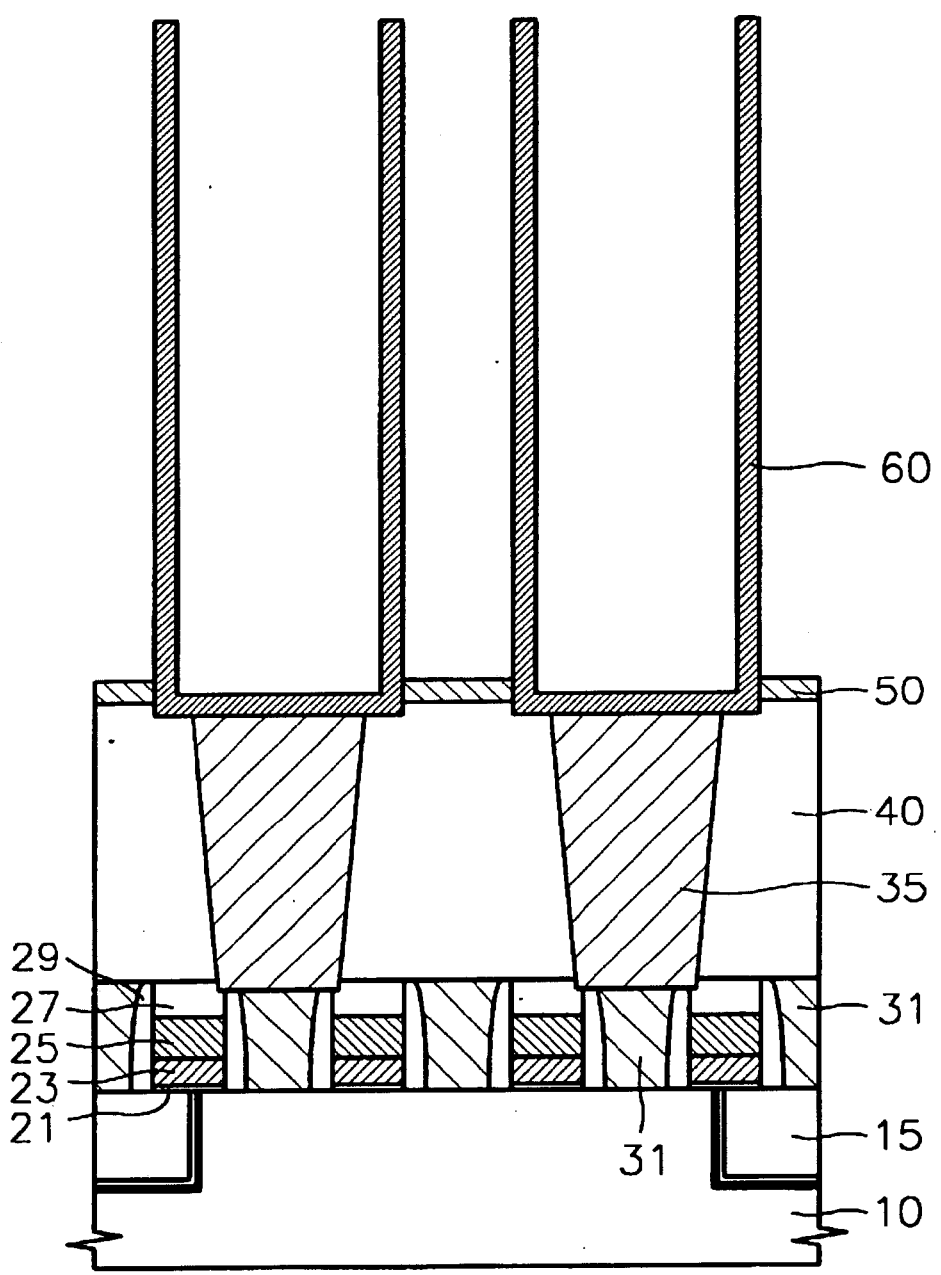
FIG. 1 is a schematic cross-sectional view illustrating the structure of a storage node in the shape of a cylinder stack.
Figure 2:
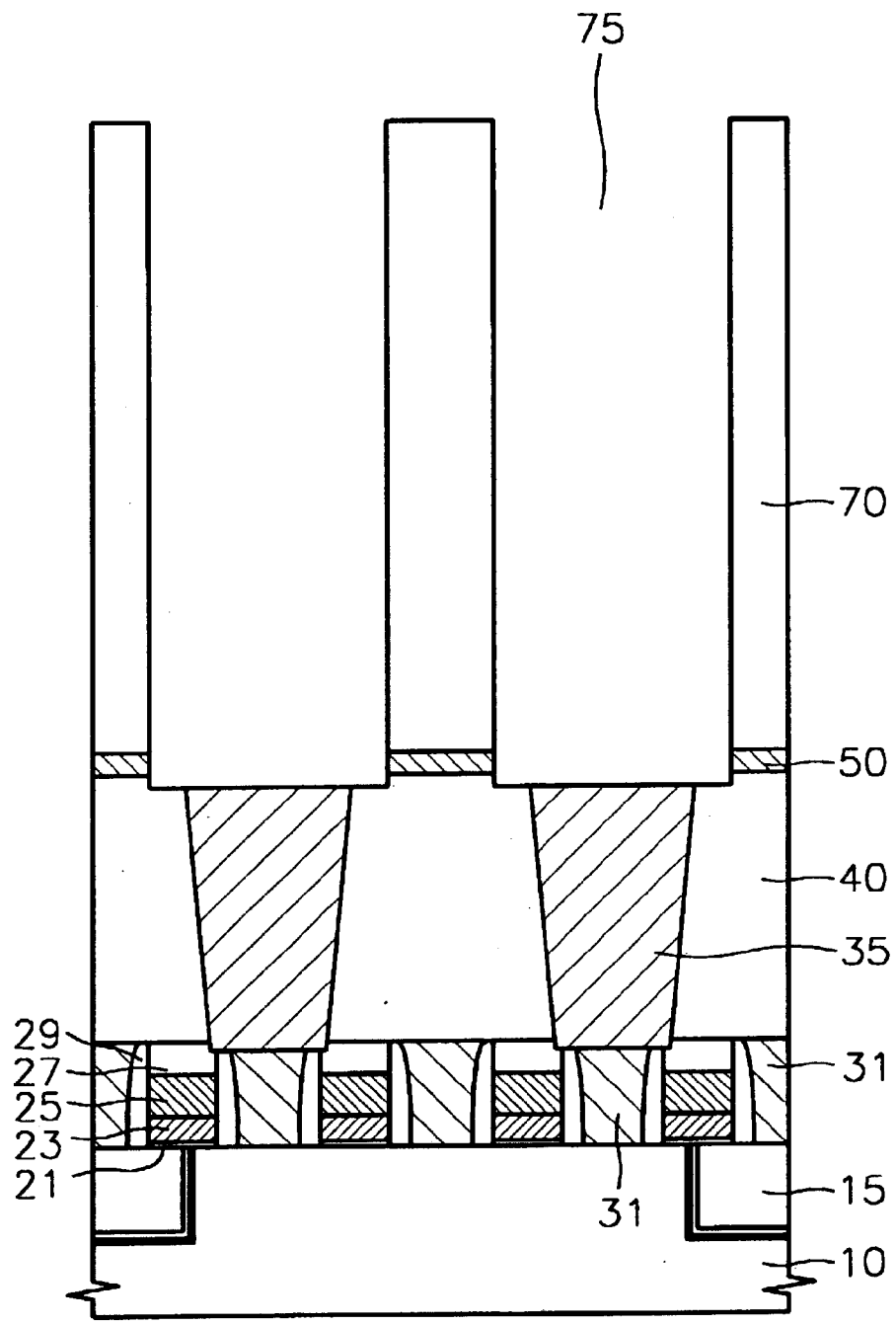
FIG. 2 is a schematic cross-sectional view illustrating a mold layer introduced to give a cylindrical shape to the storage node shown in FIG. 1.

The present invention now will be described more fully with reference to the accompanying drawings, in which preferred exemplary embodiments of the present invention are shown. This invention may, however, be embodied in many different forms and should not be construed as being limited to the embodiments set forth herein. Rather, these embodiments are provided so that this disclosure will be thorough and complete and will fully convey the concept of the present invention to those skilled in the art. In the drawings, the thickness of layers and regions are exaggerated for clarity. It will also be understood that when a layer is referred to as being "on" another layer or a substrate, it can be located directly on the other layer or the substrate, or intervening layers may be present.

In the exemplary embodiments of the present invention, a storage node having an increased surface area is formed by introducing a new photo mask layout when the storage node of the capacitor is patterned. The new photo mask layout induces a read storage node to occupy as much of the region designed for the storage node as possible so that the surface area of the storage node can be maximized. As a result, an increase in the cell capacitance is achieved. The present invention will now be described with reference preferred exemplary embodiments.

Embodiment 1

Figure 7:
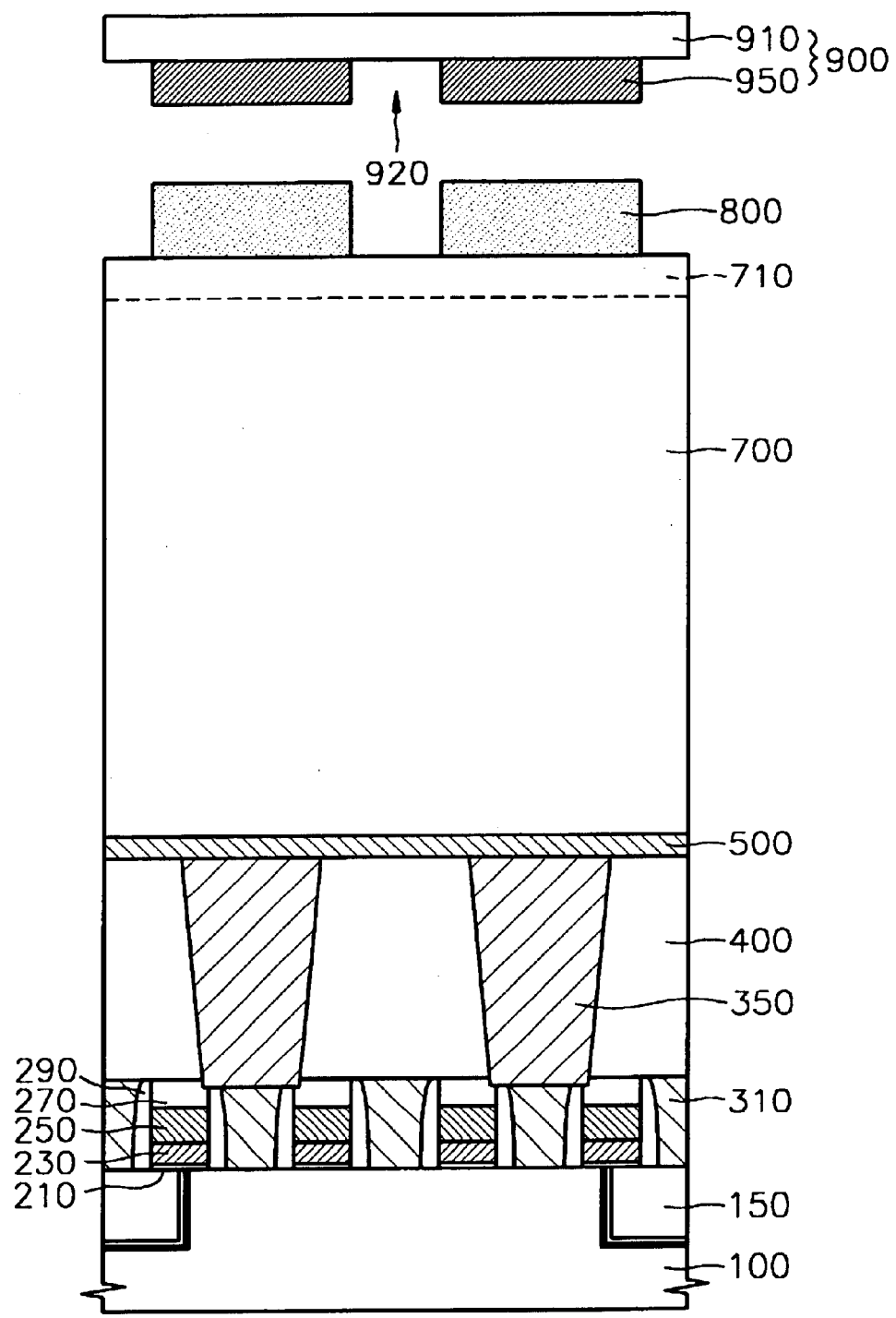
FIGS. 7 and 12–16 are schematic views illustrating a method for manufacturing a storage node of a capacitor of a semiconductor device according to a first exemplary embodiment of the present invention.

FIGS. 7 through 16 are schematic views illustrating a method for manufacturing the storage node of a capacitor of a semiconductor device according to a first exemplary embodiment of the present invention. Referring first to FIG. 7, an isolation region 150 is formed on a semiconductor substrate 100. A gate oxide layer 210, gate patterns 230 and 250, a capping layer 270, and a spacer 290 are formed on the isolation region 150 to form the structure of a transistor of a semiconductor device. Next, a conductive plug 350 and a conductive pad 310 are formed to provide an electrical connection between the semiconductor substrate 100 and the storage node. An insulating interlayer 400 is formed to insulate the conductive plug 350 and the conductive pad 310. The conductive plug 350 is electrically connected to the semiconductor substrate 100 by passing through the insulating interlayer 400 and by being connected to the conductive pad 310 insulated from the gate patterns 210 and 250 by the spacer 290 and the capping layer 270. The conductive plug 350 can be formed of a conductive material such as, but not limited to, conductive polycrystalline silicon.

An electrode supporter layer 500 is formed to cover the insulating interlayer 400 and the conductive plug 350. The electrode supporter layer 500 supports the storage node, which is shaped as a three-dimensional cylindrical stack. The electrode supporter layer 500 includes an etch stopper which can be used to stop the etching during the etch process when patterning a back end mold layer. A mold layer 700 is formed on the electrode supporter layer 500 to give the storage electrode a three-dimensional shape, such as, for example, a cylinder stack. The mold layer 700 can be selectively removed after the storage node has been formed. Therefore, the mold layer 700 can be formed of a material which is convenient for removal, such as an insulating material (e.g., silicon oxides). The mold layer 700 may be formed to have a thickness that is greater than the thickness of the storage node that is to be formed. For example, the mold layer 700 may have a thickness approximately 1000–2000 Å greater than the thickness of the storage node to be formed. The thicker portion 710 of the mold layer 700 is prepared for the hard mask that is used in the etching process for patterning the mold layer 700.

Next, a photoresist layer is formed on the mold layer 700. A photoresist pattern 800 is formed from the photoresist layer by performing a photolithography process. The photoresist pattern 800 is formed to shield the portions of the mold layer 700 where the storage node is to be located. The storage node is formed so that it is arranged on the conductive plug 350. The photoresist pattern 800 is formed over the position where the conductive plug 350 is located.

A photomask 900 is used in the photolithography process which patterns the photoresist pattern 800. The photomask 900 includes a medium layer 910 for transmitting light, (e.g., a quartz substrate) and a light shielding portion 950 selectively formed on the medium layer 910 to selectively shield the light transmitted through the light transmitting region (e.g., a chrome (Cr) layer). The shape of the photoresist pattern 800 as illustrated in FIG. 7 is patterned by transferring the layout of the shielding portion 950 of the photomask 900 by the photolithography process performed on the photoresist layer.

Figure 8:
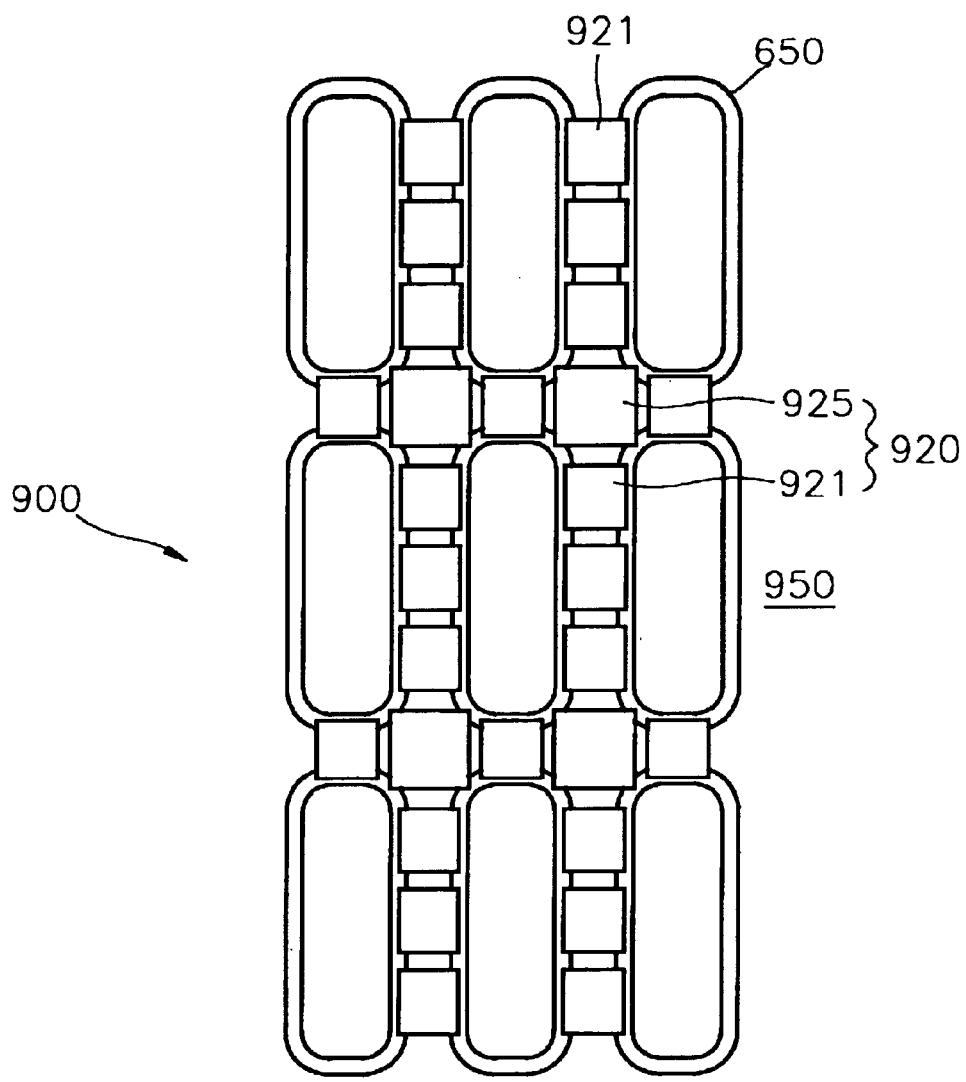
FIGS. 8–11, 17, and 18 are schematic views illustrating the shape of the storage node according to the first exemplary embodiment of the present invention.

Referring now to FIG. 8, an illustration of the layout of the photomask 900 illustrated in FIG. 7 can best be seen. The photomask 900 includes a light shielding pattern 950 introduced on the medium layer 910 shown in FIG. 7, which is formed of a transparent material, such as a quartz substrate.

The light shielding pattern 950 includes a light transmitting region 920 that includes a portion of the medium layer 910 exposed by the light shielding pattern 950. The light transmitting region 920 includes an array of light transmitting patterns 921 and 925 that are isolated from each other and are separated by the light shielding pattern 950.

The light transmitting patterns 921 and 925, which are defined as the light transmitting region 920, are arranged to form an array having a particular shape, such a rectangular array. For example, light transmitting patterns 921 and 925 can be arranged to surround the outline of the storage electrode 650 that is to be formed. Thus, the region where the storage electrode 650 will be formed is defined by the array of the light transmitting patterns 921 and 925.

The light transmitting patterns 921 and 925 can be designed to have either uniform or different shapes and/or sizes. For example, the light transmitting patterns 921 and 925 can be designed to have plane shapes such as a quadrangle, a circle, or an ellipse. In addition, the first light transmitting patterns 921 can be formed to have sizes different from those of the second transmitting patterns 925. For example, the first light transmitting patterns 921 can have sizes smaller than the sizes of the second light transmitting patterns 925. In this situation, the second light transmitting patterns 925 may be positioned at the corners of the quadrangle formed by the array of the light transmitting patterns 921 and 925.

If a photoresist layer is exposed using the photomask 900 on which the light transmitting patterns 921 and 925 are arranged, the light transmitted through the light transmitting patterns 921 and 925 can have mutual interference effects. In other words, it is possible that a mutual interference of light occurs at the corners of the light shielding pattern 950. If the distance between the light transmitting patterns 921 and 925 approaches to or is less than the resolution limit of the photolithography process, the light transmitting patterns 921 and 925 transferred to the photoresist layer naturally display pattern bridges and are connected to each other.

Figure 9:
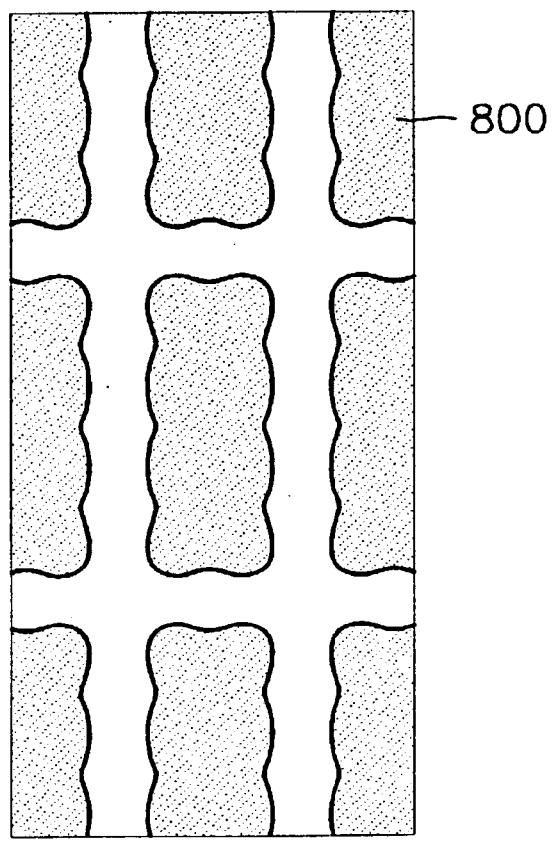

Since the light transmitting patterns 921 and 925 are transferred and printed with pattern bridges due to the resolution limit in the exposure process on the photoresist layer, the photoresist pattern 800 formed through the development process can have sharp edges. If the light transmitting patterns 921 and 925 are arranged by adjusting the sizes, the shapes, or the arrangement of the positions of the light transmitting patterns 921 and 925, it is possible to embody a photoresist pattern 800 that is substantially in the shape of a rectangle. In addition, it is possible to form a photoresist pattern 800 which has curved or indented sides, as shown in FIG. 9, by adjusting the positions, the relative sizes, or the shapes of the light transmitting patterns 921 and 925. It is therefore possible to cause the occurrence of pattern bridges as described above by introducing supplementary patterns such as a general scattering bar during the exposure process.

Figure 10:
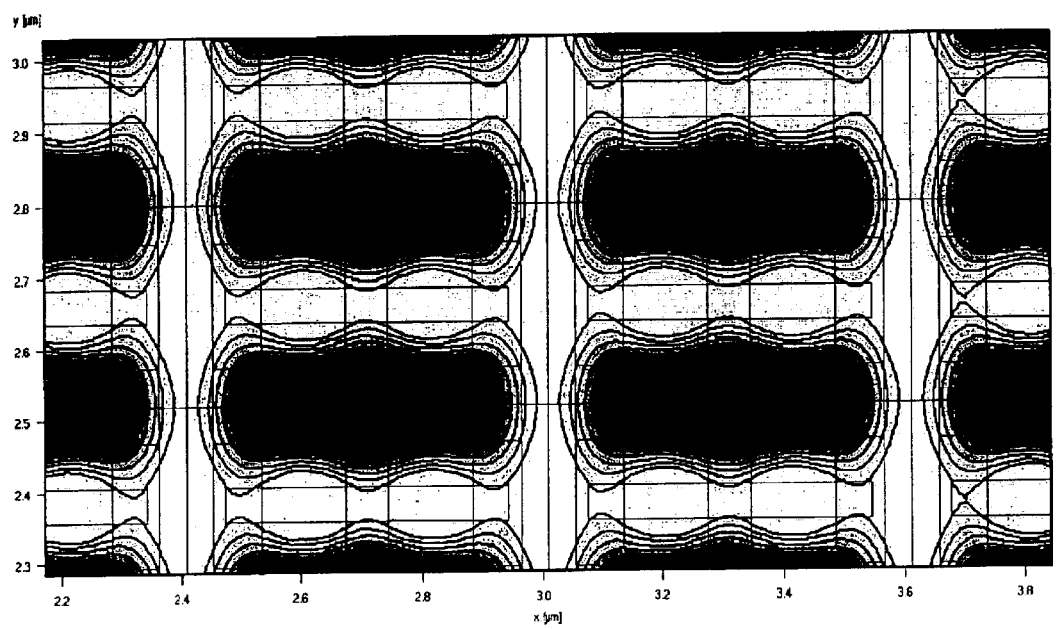
Figure 11:
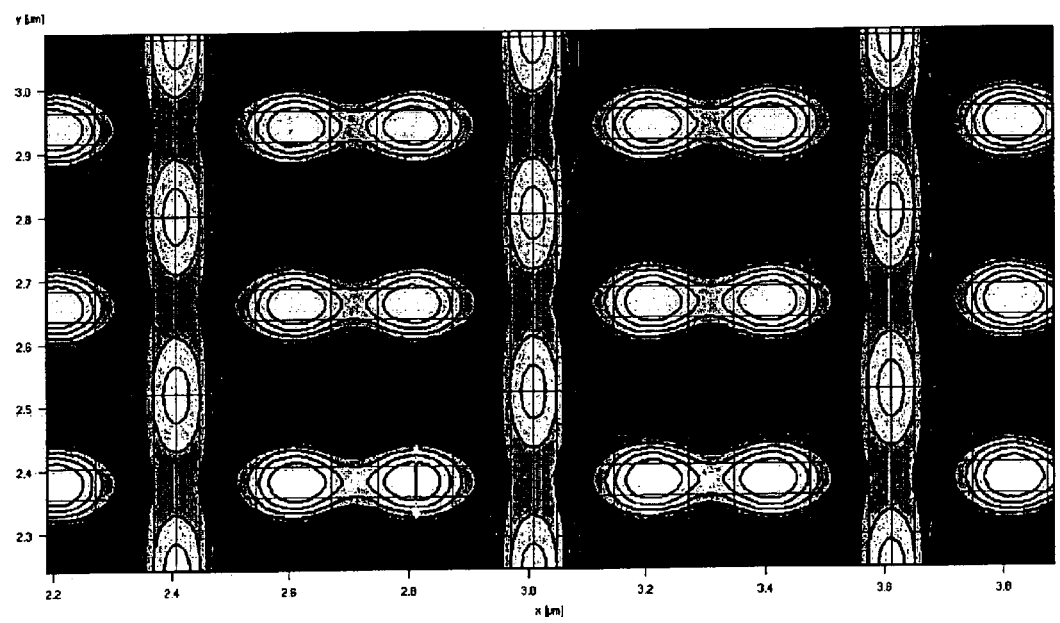

The photoresist pattern 800 can have a substantially rectangular shape or curved sides by adjusting the arrangements, the relative sizes, or the shapes of the light transmitting patterns 921 and 925 as described above and illustrated in the photo simulations set forth in FIGS. 10 and 11. The results shown in FIGS. 10 and 11 are obtained by adjusting the light transmitting patterns 921 and 925, and by introducing a supplementary pattern, such as a scattering bar. FIGS. 10 and 11 demonstrate that the photoresist pattern can have a substantially rectangular shape as shown in FIG. 10, or can have intended sides, such as is shown in FIG. 11.

Figure 12:
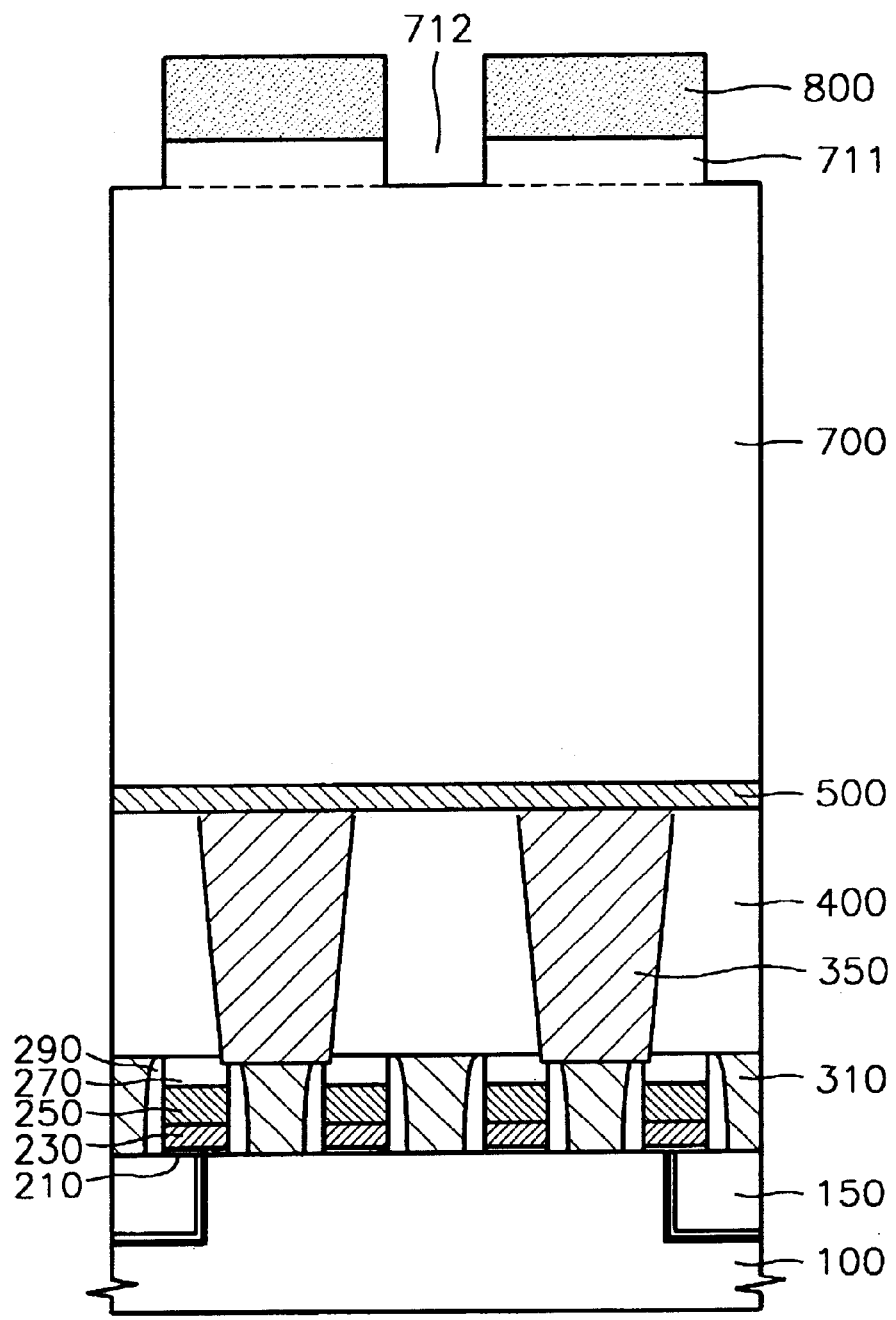

Referring now to FIG. 12, a schematic illustration showing the formation of a mold portion 711 for a hard mask formed by partially etching the mold layer 700 exposed by the photoresist pattern 800 can be seen. The portion of the mold layer 700 exposed by the photoresist pattern 800 is selectively etched using the photoresist pattern 800 as an etching mask. The etching depth typically ranges between 1000 Å and 2000 Å. Thus, a portion of the mold layer formed is higher (e.g. 1000–2000 Å higher than the height of the storage node to be formed (reference numeral 710 of FIG. 7). This portion 710 is selectively etched and removed. The mold portion 711 for a hard mask having a groove 712 in which the hard mask is deposited is then prepared to pattern the hard mask layer.

Figure 13:
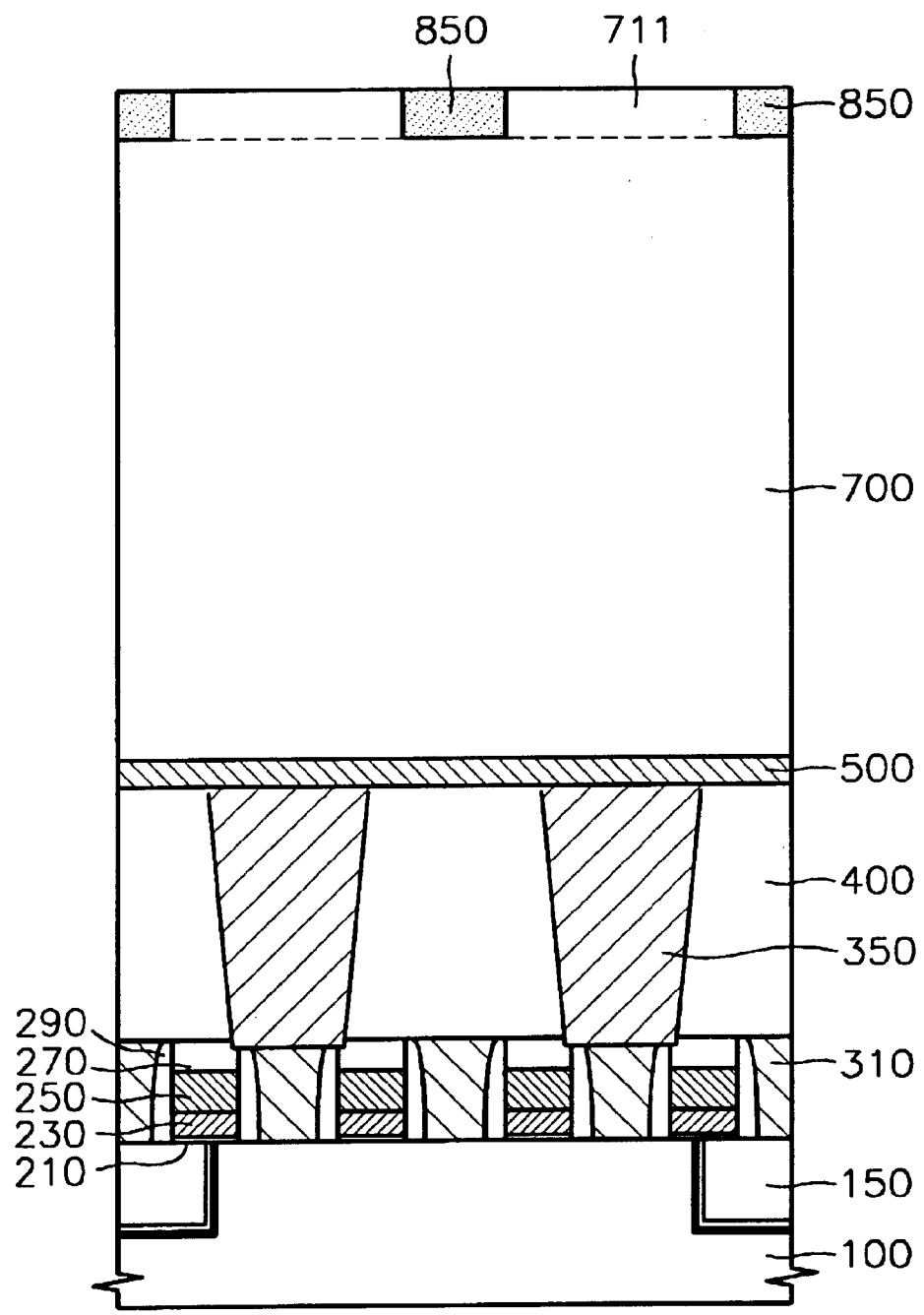

FIG. 13 schematically illustrates a process for forming the hard mask 850. After the photoresist pattern (reference numeral 800 of FIG. 12) is removed, a hard mask layer is formed. The hard mask layer is for filling the groove 712. If the mold layer 700 is formed of silicon oxide, the hard mask layer may be formed of silicon nitride ($Si_3N_4$) or a polycrystalline silicon for high etch selectivity. Next, a patterned hard mask 850 is formed by planarizing the front surface of the hard mask layer, thereby exposing the top surface of the mold portion 711 and filling the groove 712. The planarization may be performed using chemical mechanical polishing (CMP) or an etch back.

Figure 14:
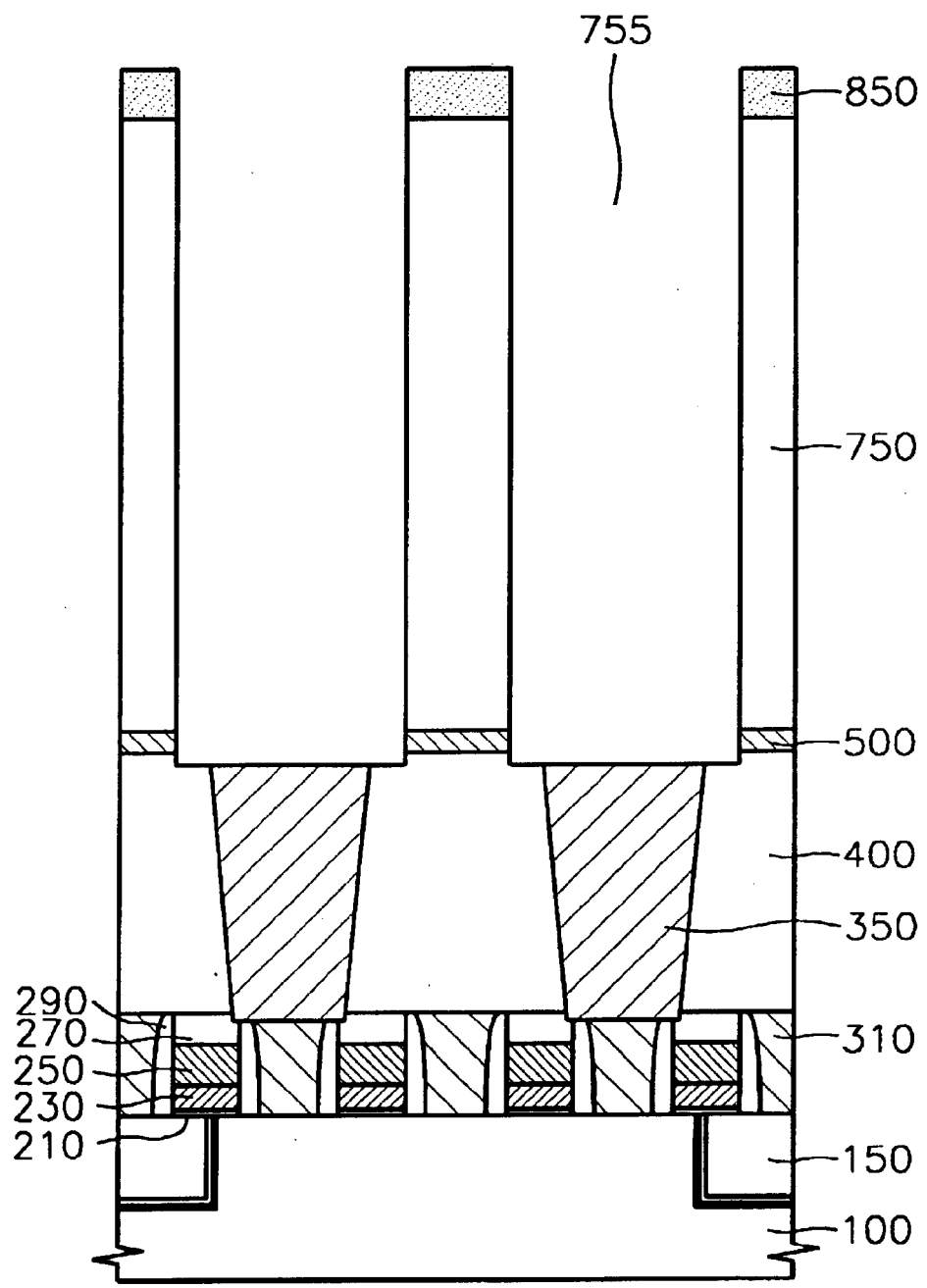

FIG. 14 illustrates the formation of a mold 750 for a storage node by patterning the mold layer 700 of FIG. 13 using the patterned hard mask 850 as an etching mask. In particular, the mold 750, which forms a storage node having a three-dimensional shape is formed by selectively etching the mold portion 711 and the mold layer 700 using the patterned hard mask 850 as an etching mask. The etching is performed using an etching process having excellent directional characteristics, such as, for example, dry etching. The etching process is performed until the upper surface of the lower conductive plug 350 is exposed, at which time the etch stops located on the supporter layer 500 stop the etching process. As a result, the mold 750 has an opening 755 where the storage node is to be formed.

Figure 15:
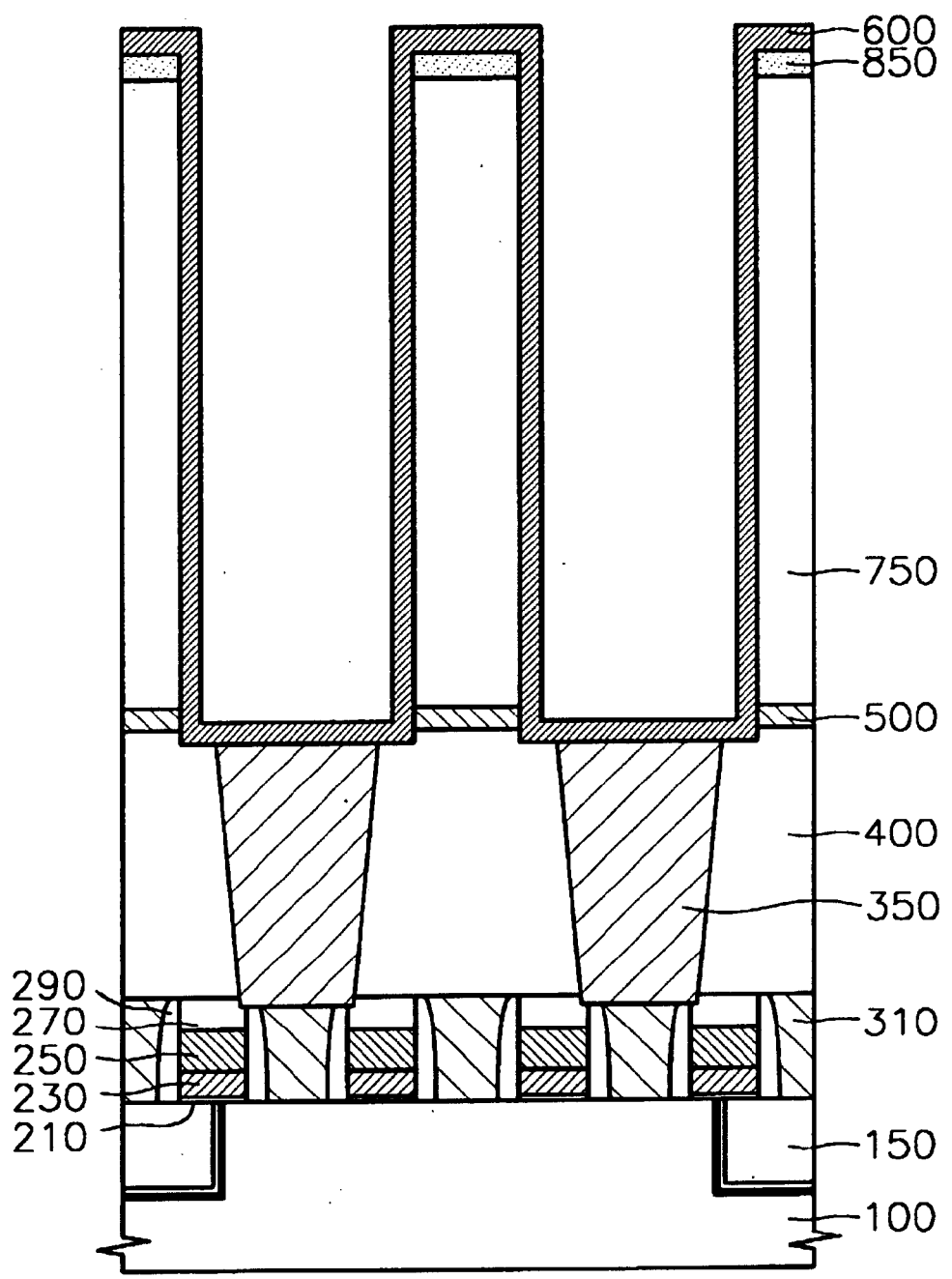

FIG. 15 schematically illustrates the formation of the storage node layer 600 which is electrically connected to the conductive plug 350 along with the mold 750. In particular, the storage node layer 600 is arranged as a thin layer covering the mold 750. The storage node layer 600 can be a conductive polycrystalline silicon layer.

Figure 16:
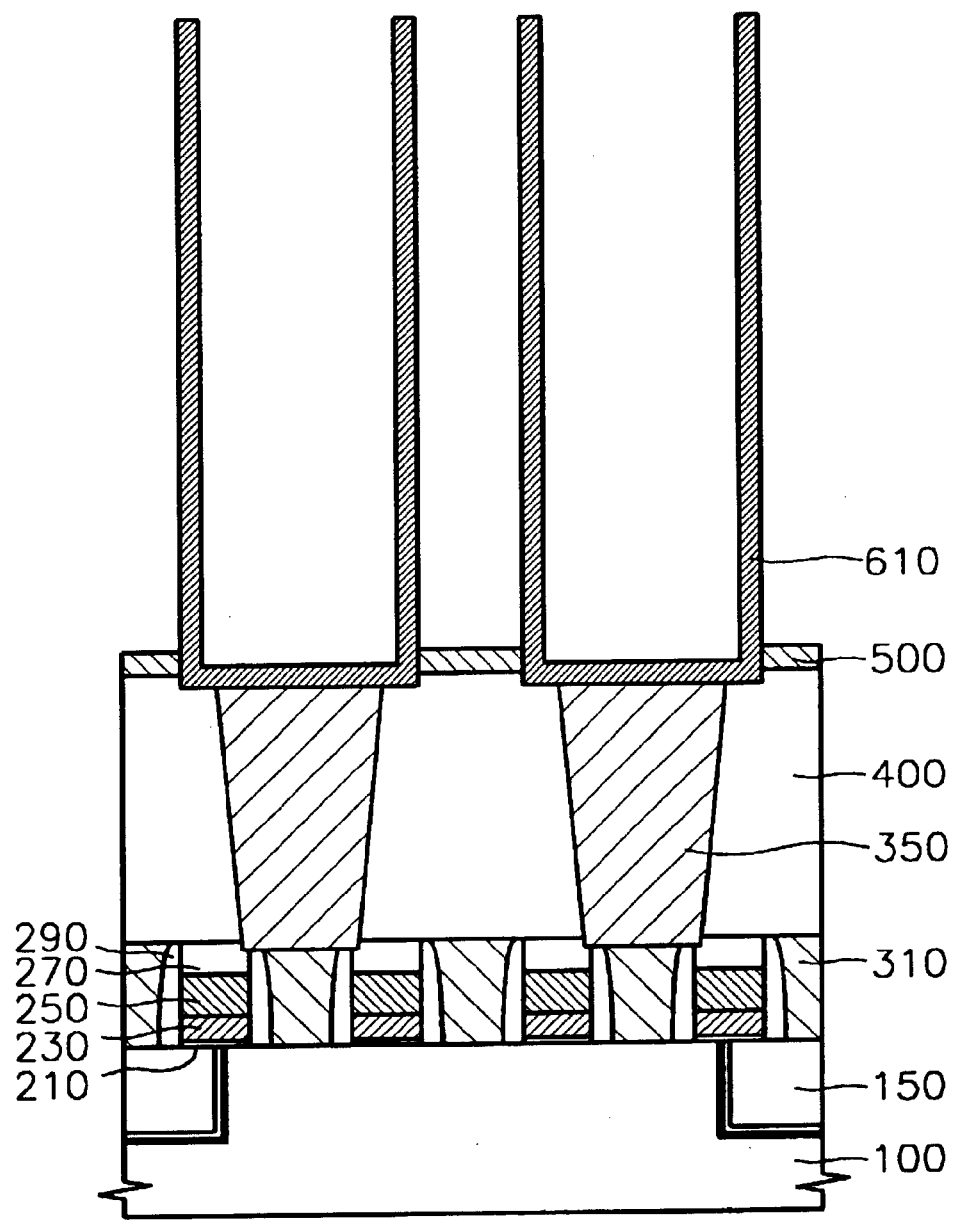

FIG. 16 schematically illustrates separating the storage node layer 600 into the storage node 610. The storage node 610 is separated into cells by planarizing the front surface of the storage node layer 600 and then exposing the upper surface of the mold 750 shown in FIG. 15. The planarization can be performed, for example, by using chemical mechanical polishing (CMP) or an etch back. Next, the storage node 610 is completed by selectively removing the mold 750 using a removal process such as wet etching.

The opening 755 in the mold 750 is transferred by the photoresist pattern 800 (shown in FIG. 9) by the hard mask 850, and therefore can have the same shape as that of the photoresist pattern 800. Accordingly, the outlined shape of the top plan view of the storage node in which the shape of the opening 755 is transferred is transferred by the mold 750 of storage node.

Figure 17:
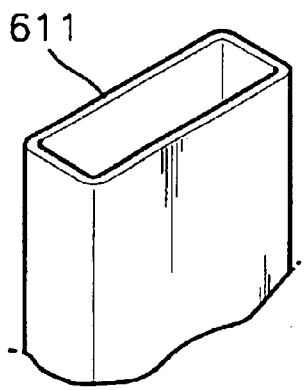
Figure 18:
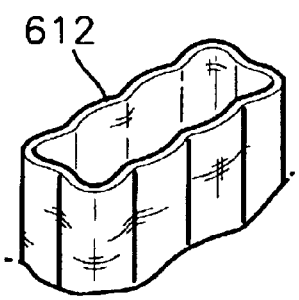

FIGS. 17 and 18 are schematic views illustrating the shape of the storage node 610 according to the first exemplary embodiment of the present invention. In particular, the outlined shape of the storage node 610 is the shape of the photoresist pattern (reference numeral 800 of FIG. 9). Referring generally to FIGS. 7 through 12, if the shape of the photoresist pattern 800 is substantially rectangular, the shape of the storage node 610 can also be substantially rectangular, as can be seen in FIG. 17. In this situation, the edges of the rectangle of the storage node 611 (FIG. 17) are prevented from being rounded in the etching process as much as possible. Thus, the area of the region that the storage node 611 occupies is not reduced. Therefore, an overall increase of the effective surface area of the storage node 611 is obtained.

Figure 3:
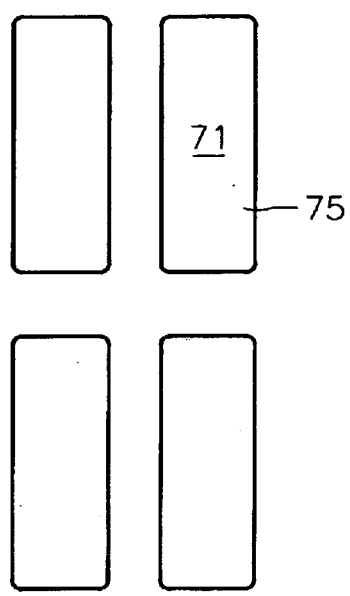
FIG. 3 is a schematic view illustrating a photo mask layout used to form the opening in the mold layer that is to be occupied by the storage node.
Figure 4:
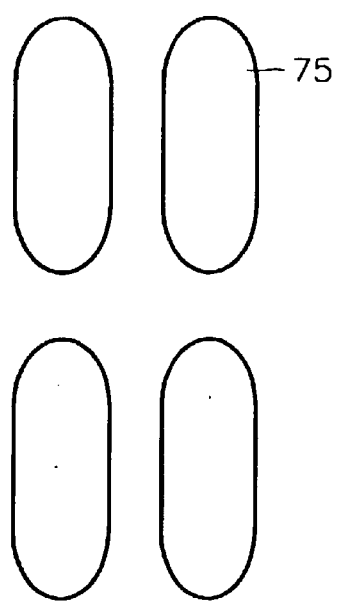
FIG. 4 is a schematic view illustrating the elliptical shape of the opening of the mold layer.
Figure 5:
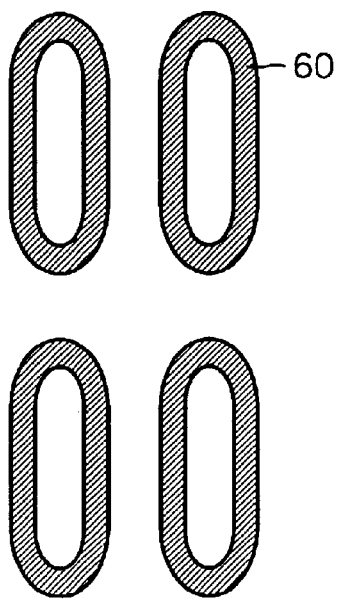
FIG. 5 is a schematic view illustrating the shape of a storage node occupying the opening illustrated in FIG. 4.
Figure 6:
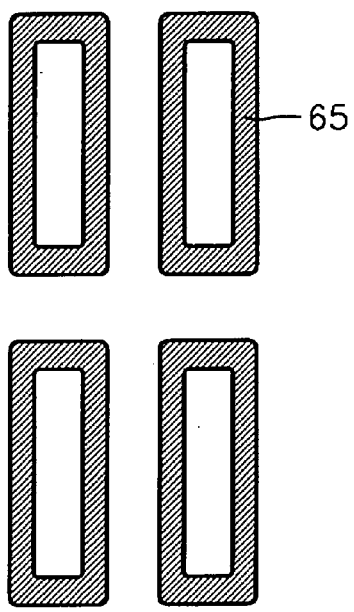
FIG. 6 is a schematic view illustrating the the intended rectangular shape of the storage node.

As described above with reference to FIG. 3, if the region occupied by the storage node 611 is close to the originally designed region, i.e., substantially in the shape of a rectangle, the effective surface area of the storage node 611 is increased. If the storage node 611 has a rectangular shape as shown in FIG. 17, the capacitance thereof is increased by about 2 pF to 4 pF compared to a storage node that is formed substantially in the shape of an ellipse, such as storage node 60 illustrated in FIG. 5. By having a substantially rectangular shape, the capacitance in a cell of a DRAM device is at least 30 pF.

In addition, if the sidewalls of the photoresist pattern 800 are undulated or indented as shown in FIG. 9, the sidewalls of the storage node 612 in a cylindrical shape are undulated as well, as is shown in FIG. 18. The undulated sidewalls greatly increases the surface area of the storage node 612. This increase of the surface area of the storage node 612 causes an increase in the capacitance by about 4 pF to 5 pF. This increase of capacitance is estimated to be equivalent to an increase of capacitance obtained by increasing the height of the storage node 610 by about 2000 Å.

Accordingly, the method for manufacturing a storage node according to the first exemplary embodiment of the present invention eliminates the need to increase the height of the storage node to increase the capacitance. An increase in the height of the storage node accompanies the process of narrowing an etching process margin, which results in an increase in the probability of twin bit fails. Thus, in the first exemplary embodiment of the present invention, the capacitance of a storage node is increased while the height of the storage node is not increased. Moreover, the method according to the first exemplary embodiment of the present invention effectively prevents twin bit fails.

Furthermore, in the first exemplary embodiment of the present invention, twin bit fails can be prevented by etching the mold layer 700 by introducing a patterned hard mask (reference numeral 850 of FIG. 13). If the patterned hard mask 850 is introduced, it is possible to obtain more etching process margins, which permits the distance between the storage nodes to decrease. Accordingly, the area of the region to be occupied by the storage node 610 increases. As described above, the increase in area of the storage node can increase the capacitance of the capacitor.

Although the first exemplary embodiment of the present invention has been described with reference to introducing a hard mask 850, it is possible to use a photoresist pattern as an etching mask without introducing the hard mask 850. Also, the first exemplary embodiment of the present invention has been described with reference to using a positive photoresist for introducing the hard mask 850, but it is possible to form the mold for the storage node by using a photoresist pattern which is patterned using a negative photoresist if the photoresist pattern is directly used as an etching mask.

As described above, the method for manufacturing the storage node of the capacitor of a semiconductor device according to the first exemplary embodiment of the present invention discloses how to use a photo mask having a plurality of light transmitting patterns separated from each other and located/arranged around the contour of the storage node region. In addition, the first exemplary embodiment of the present invention discloses how to expose and develop a photoresist pattern in a rectangular region originally designed for the storage node and to expose and develop a photoresist pattern that has a substantially rectangular shape with curves on the sidewalls by forming pattern bridges between the photoresist patterns due to limits of resolution when the pattern shape is transferred to the photoresist using a photo mask.

Nonetheless, it is possible to obtain the contour of a storage node in a substantially rectangular shape as shown in FIG. 17, or in a substantially rectangular shape with undulated sidewalls as shown in FIG. 18 by using a photomask layout according to the exemplary embodiments of the present invention described herein without forming pattern bridges when the shape of the patterns designed on the photomask are transferred to the photoresist pattern.

Embodiment 2

FIGS. 19 through 29 are schematic views illustrating a method for manufacturing the storage node of a capacitor of a semiconductor device according to a second exemplary embodiment of the present invention.

Figure 19:
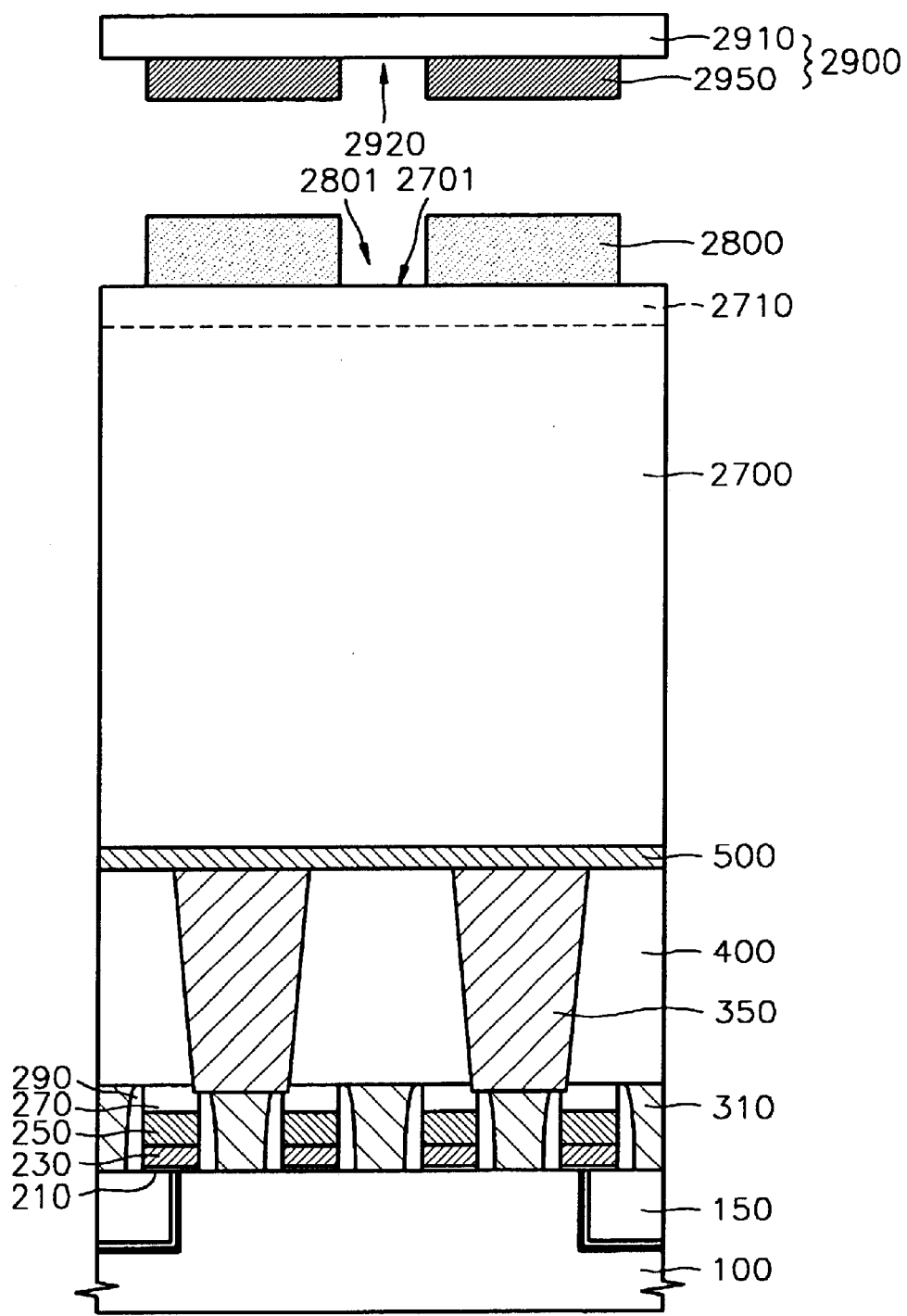
FIGS. 19, 22–23, 25, and 27–28 are schematic views illustrating a method for manufacturing a storage node of a capacitor of a semiconductor device according to a second exemplary embodiment of the present invention.

Referring to FIG. 19, a schematic view illustrating the formation of a photoresist pattern 2800 on a mold layer 2700 using a photolithography process can best be seen. A conductive plug 350 on a semiconductor substrate 100 for electrically connecting the semiconductor substrate 100, the storage node, and an electrode supporter layer 500 is formed on an insulating interlayer 400 which insulates for insulating the conductive plug 350. A mold layer 2700 is formed on the electrode supporter layer 500. The mold layer 2700 is introduced to give a three-dimensional shape, such as, for example, a cylindrical shape, to the storage node. The mold layer 2700 can be selectively removed after the storage node is formed, and as such, can be formed of a medium convenient for its removal. One suitable material for use as the mold layer is an insulating material such as silicon oxide.

The mold layer 2700 is formed to have a height greater than the height of the storage node to be formed later. For example, the mold layer 2700 is formed about 2000 Å to 3000 Å higher than the height of the storage node. Preferably, the mold layer 2700 shown in FIG. 19 is higher than the mold layer 700 shown in FIG. 7 in the first exemplary embodiment. The portion of the mold layer that is higher than the height of the storage node (i.e., reference numeral 2710) is prepared in a mold for patterning a hardmask used in the etching process to pattern the mold layer 2700.

Next, a photoresist layer is formed on the mold layer 2700. A photoresist pattern 2800 is formed from the photoresist layer by performing a photolithography process. The photoresist pattern 2800 is formed to shield the region where the storage node is to be formed. In particular, the storage node is to be located on the conductive plug 350, and the photoresist pattern 2800 is formed over the position where the conductive plug 350 is located.

The photolithography process used to form the photoresist pattern 2800 uses a photomask 2900 of a layout according to the second exemplary embodiment of the present invention. The photomask 2900 can include a medium layer 2910, (e.g., a quartz substrate) for transmitting light, and a light shielding pattern 2950 formed on the medium layer 2910 (e.g., a chrome (Cr) layer) for selectively shielding light. The shape of the photoresist pattern 2800 as shown in FIG. 19 is patterned by transferring the layout of the light shielding pattern 2950 to the photomask 2900 by photolithography process.

Figure 20:
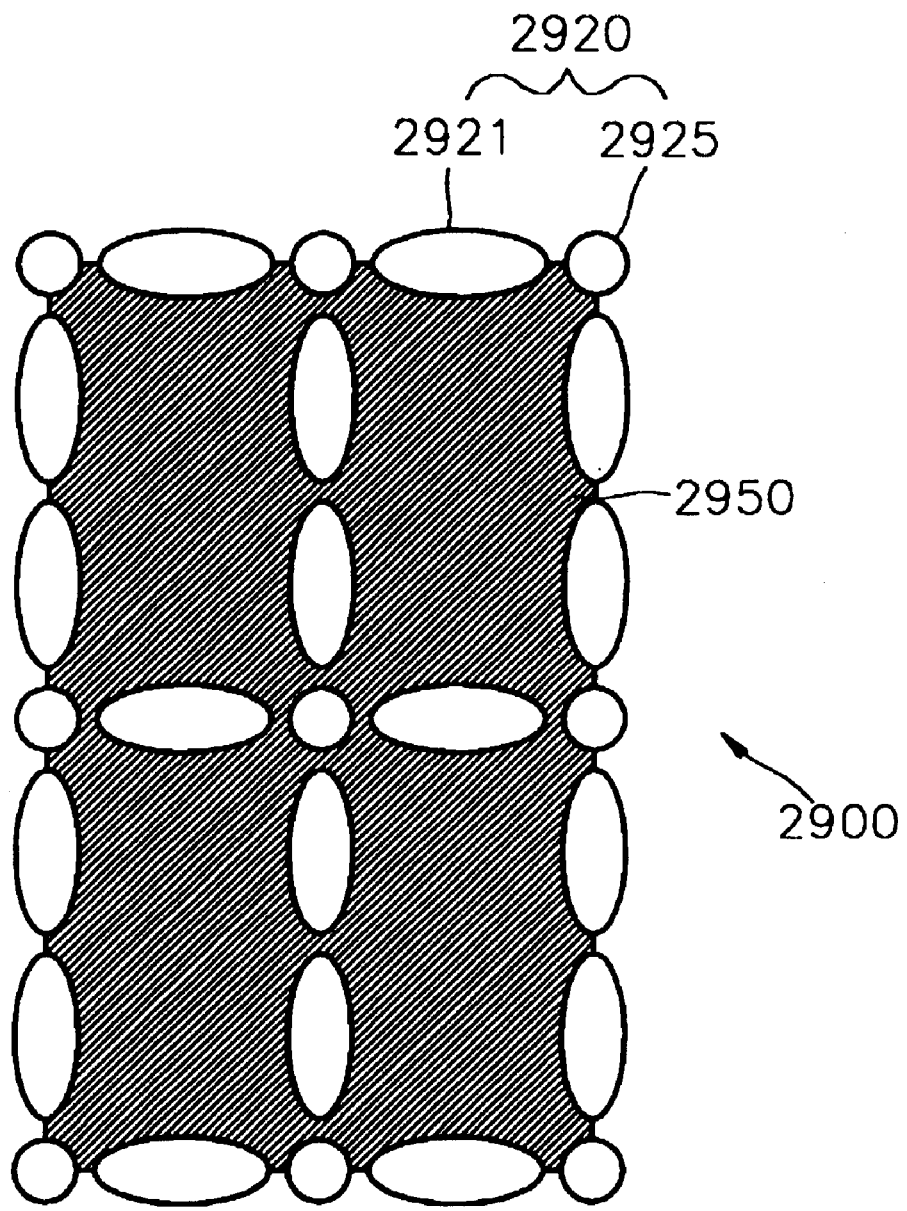
FIGS. 20–21, 24, 26, and 29 are schematic views illustrating the shape of the storage node according to the second exemplary embodiment.

Referring now to FIG. 20, it can be seen that the photomask 2900 used in the second exemplary embodiment of the present invention includes a light shielding pattern 2950 formed of a transparent material such as a quartz substrate to shield light from the medium layer 2910 and a light transmitting region 2920 that includes the portion of the medium layer 2910 exposed by the light shielding pattern 2950. The light transmitting region 2920 includes an array of light transmitting patterns 2921 and 2925 separated from each other by the light shielding pattern 2950.

The light transmitting patterns 2921 and 2925 forming the light transmitting region 2920 are arranged to have particular shapes, such as, for example, rectangles. The light transmitting patterns 2921 and 2925 can be arranged around the contour of the storage node to be formed, i.e., the region where the storage node is to be formed is defined by the array of the light transmitting patterns 2921 and 2925.

On the other hand, each light transmitting pattern 2921 and 2925 can be substantially circular or substantially elliptical, as is shown in FIG. 20. In addition, the first light transmitting patterns 2921 can have sizes that are different from the sizes of the second light transmitting patterns 2925. For example, the first light transmitting patterns 2921 can be larger in size than the second light transmitting patterns 2925, such as can be seen in FIG. 20. In such a situation, the second light transmitting patterns 2925 may be positioned at the corners of the rectangular shape formed by the array of the light transmitting patterns 2921 and 2925.

Figure 21:
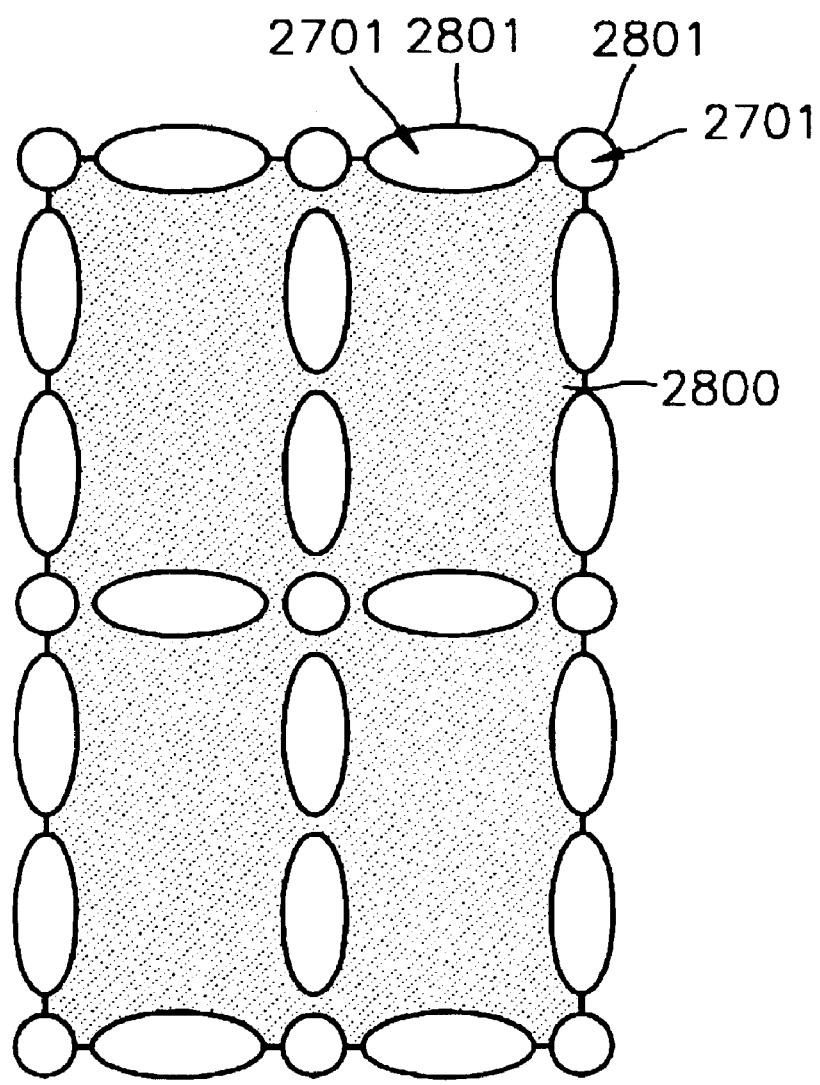

If the photoresist layer is exposed using the photomask 2900 on which the light transmitting patterns 2921 and 2925 are arranged, the shapes of the light transmitting patterns 2921 and 2925 can be transferred to the photoresist layer. Unlike in the first exemplary embodiment, pattern bridges due to the resolution limits do not occur during the exposure process, and the photoresist pattern 2800 to which the shapes and arrangements of the light transmitting patterns 2921 and 2925 are transferred without any changes will be printed as shown in FIG. 21. It is possible to introduce a supplementary pattern such as a general scattering bar during the exposure process.

Referring now to FIG. 21, a schematic view illustrating the plane shape of the photoresist pattern 2800 formed during the photolithography process using the photomask 2900 of FIG. 20 can be seen. Photoresist patterns 2800, having the same shape as the light shielding pattern 2950 of FIG. 20, are formed and create opening holes 2801 arranged in the same manner and with the same shapes as the light transmitting patterns 2921 and 2925. Therefore, the portions 2701 of the mold layer that are exposed by the opening holes 2801 of the photoresist patterns 2800 are exposed with the shapes and arrangements of the light transmitting patterns 2921 and 2925 shown in FIG. 20.

Figure 22:
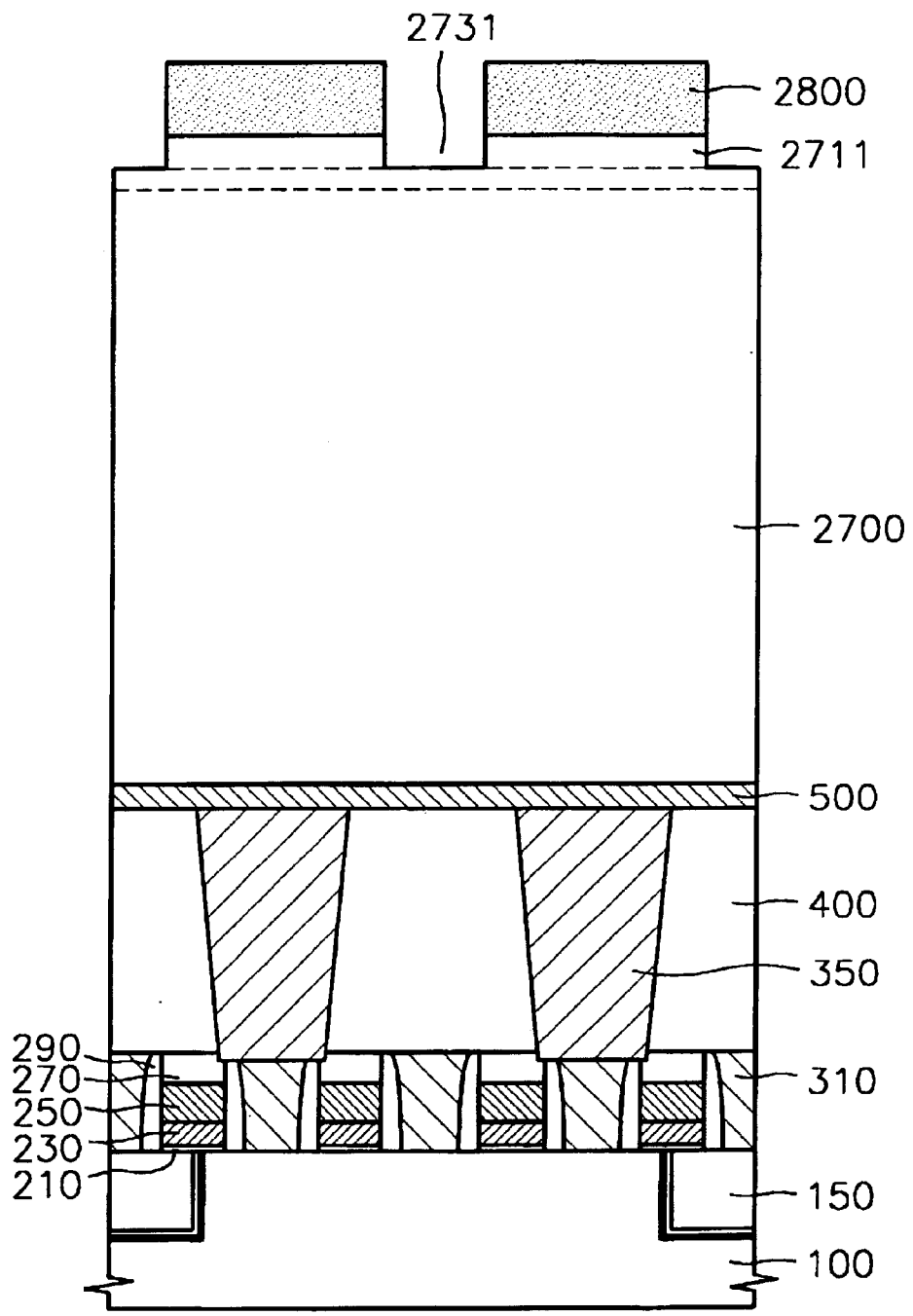

FIG. 22 schematically illustrates a first etching of the portion 2701 of the mold layer exposed by the photoresist pattern 2800 to a desired depth. In particular, the portion 2701 of the mold layer exposed by the photoresist pattern 2800 is selectively etched by using the photoresist pattern 2800 as an etching mask. The depth of the etching or the amount of the etching ranges between 1500 Å and 2000 Å. The portion 2710 illustrated in FIG. 19 of the mold layer, which has a height greater than the height of the storage node to be formed, is selectively etched to a desired thickness and then eliminated. It is preferable to use a dry etching process with good pattern transferring abilities to etch the photoresist pattern 2800.

A first portion 2711 of the remaining mold layer that has not been selectively etched has a shape that conforms to the shape of the photoresist pattern 2800. A first groove 2731, the shape of which is determined by the first portion 2711, is then formed accordingly.

Figure 23:
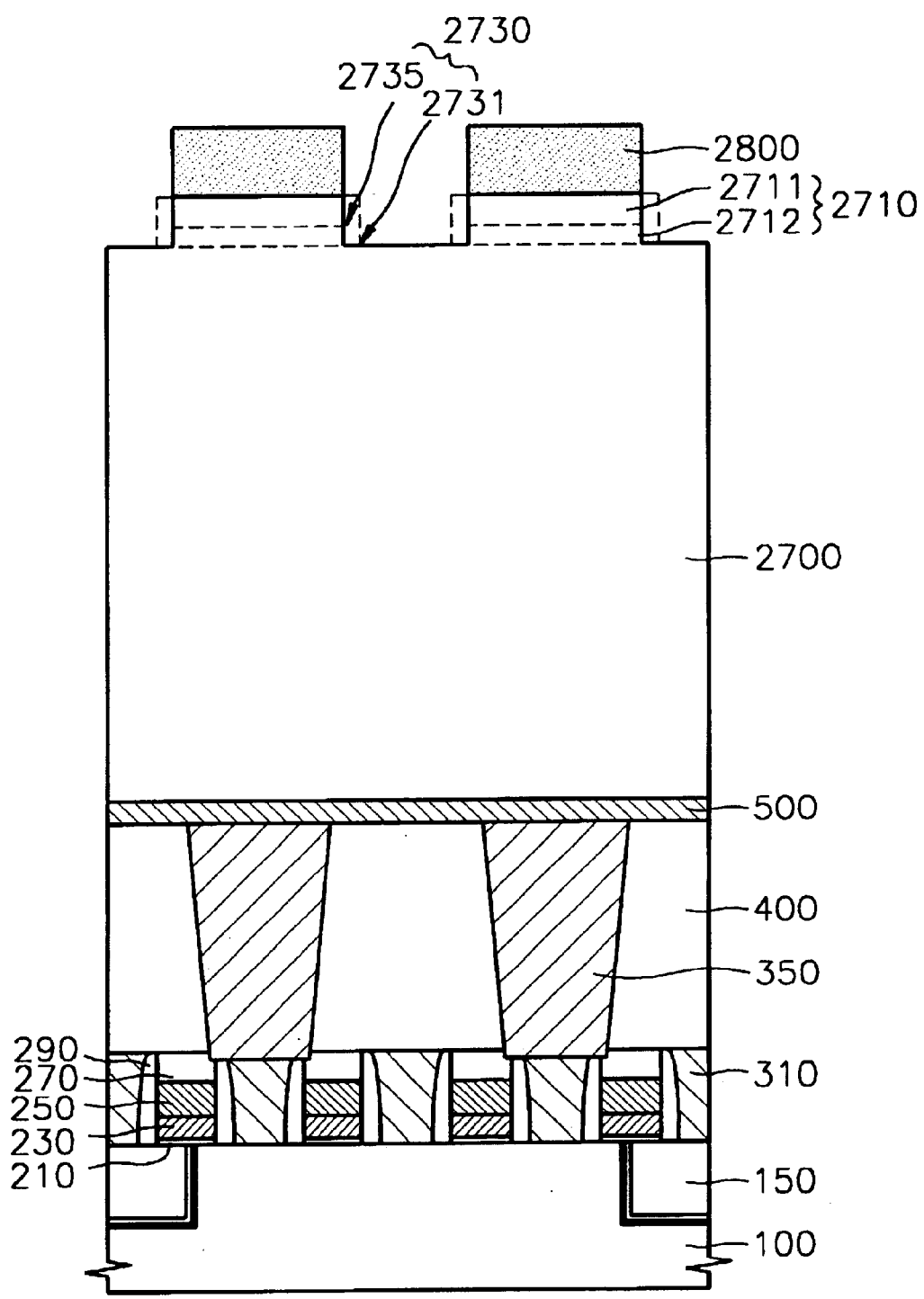
Figure 24:
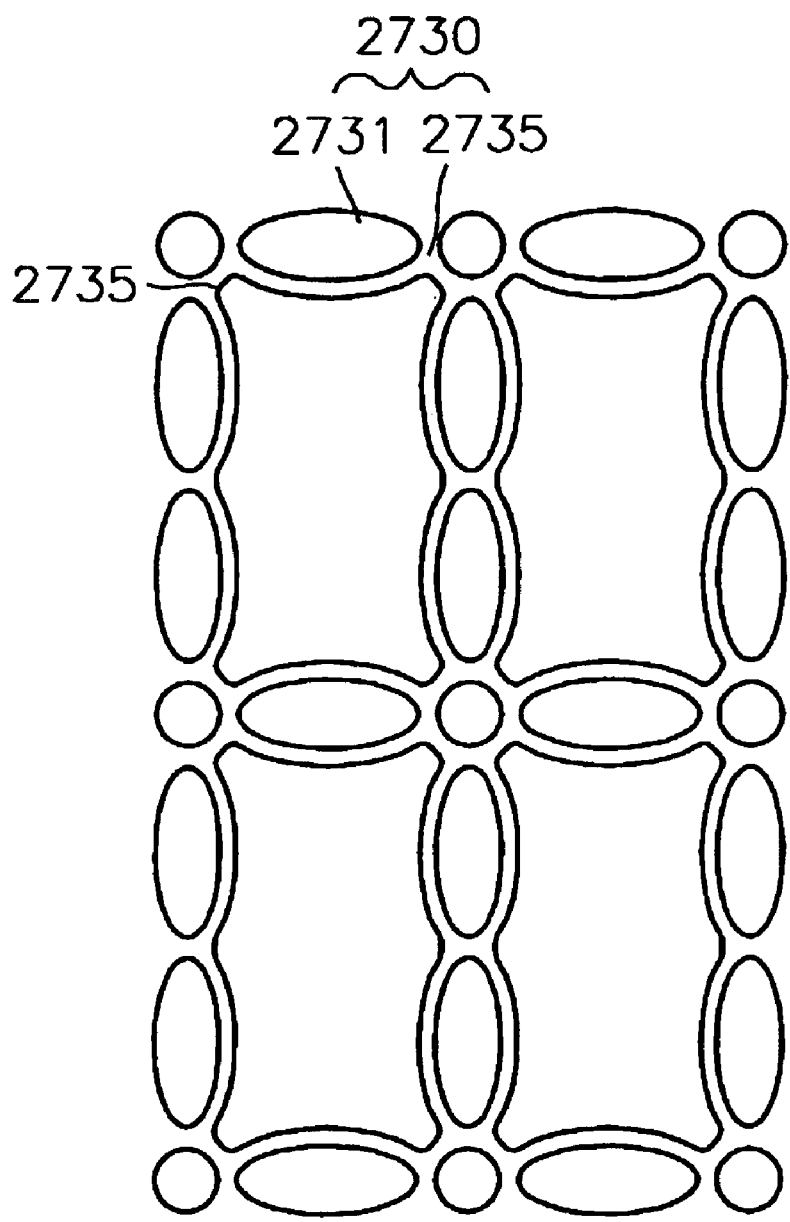

FIG. 23 schematically illustrates forming a mold portion 2710 for a hard mask with a second etching which causes pattern bridges. FIG. 24 schematically illustrates the plane shape of a groove 2730 of the mold portion 2710 for a hard mask after pattern bridges have occurred. The second etching for etching the exposed portion of the mold layer 2700 is performed using the photoresist pattern 2800 as an etching mask. The second etching is performed in order to obtain pattern bridges between the first grooves 2731 formed by the first etching. The exposed portions of the mold layer 2700 are further etched by either the second etching or by a wet etching, which is more advantageous for causing pattern bridges than dry etching. In wet etching, an etch selectivity (e.g., the etch selectivity between the photoresist pattern 2800 and the mold layer 2700) is relatively low, and a second groove 2735 for connecting in between the first grooves 2731 is formed. Thus, the region for the first grooves 2731 is widened by the wet etching and pattern bridges are formed between the first grooves 2731.

Therefore, it is possible that the photoresist pattern 2800 is also partially etched and changed to a state in which pattern bridges can occur. For example, the portion separating the opening holes 2801 shown in FIG. 21 is corroded by pattern bridges, which causes the region of the photoresist pattern 2800 to shrink. As a result, the shape of the photoresist pattern 2800 is curved by the corrosion. Consequently, the layout of the second groove 2735 has a curved sidewall, as is shown in FIG. 24. The curved sidewalls of the second groove 2735 are the result of the second etching and the resulting pattern bridges as described above.

The depth of etching in the second etching ranges from approximately 500 Å to approximately 1000 Å. The amount of wet etching can be altered depending on the distance between the first grooves 2731. If a pattern bridge has already been formed, the amount of the wet etching can be either altered or omitted.

As illustrated in FIG. 23, the mold portion 2710 includes the second portion 2712 formed during the second etching (the etching causing the pattern bridges), and the first portion 2711 formed during the first etching. Because the mold portion 2710 has the groove 2730 (i.e., the first groove 2731 and the second groove 2735), the particular shape of the hard mask is obtained in subsequent processes.

Figure 25:
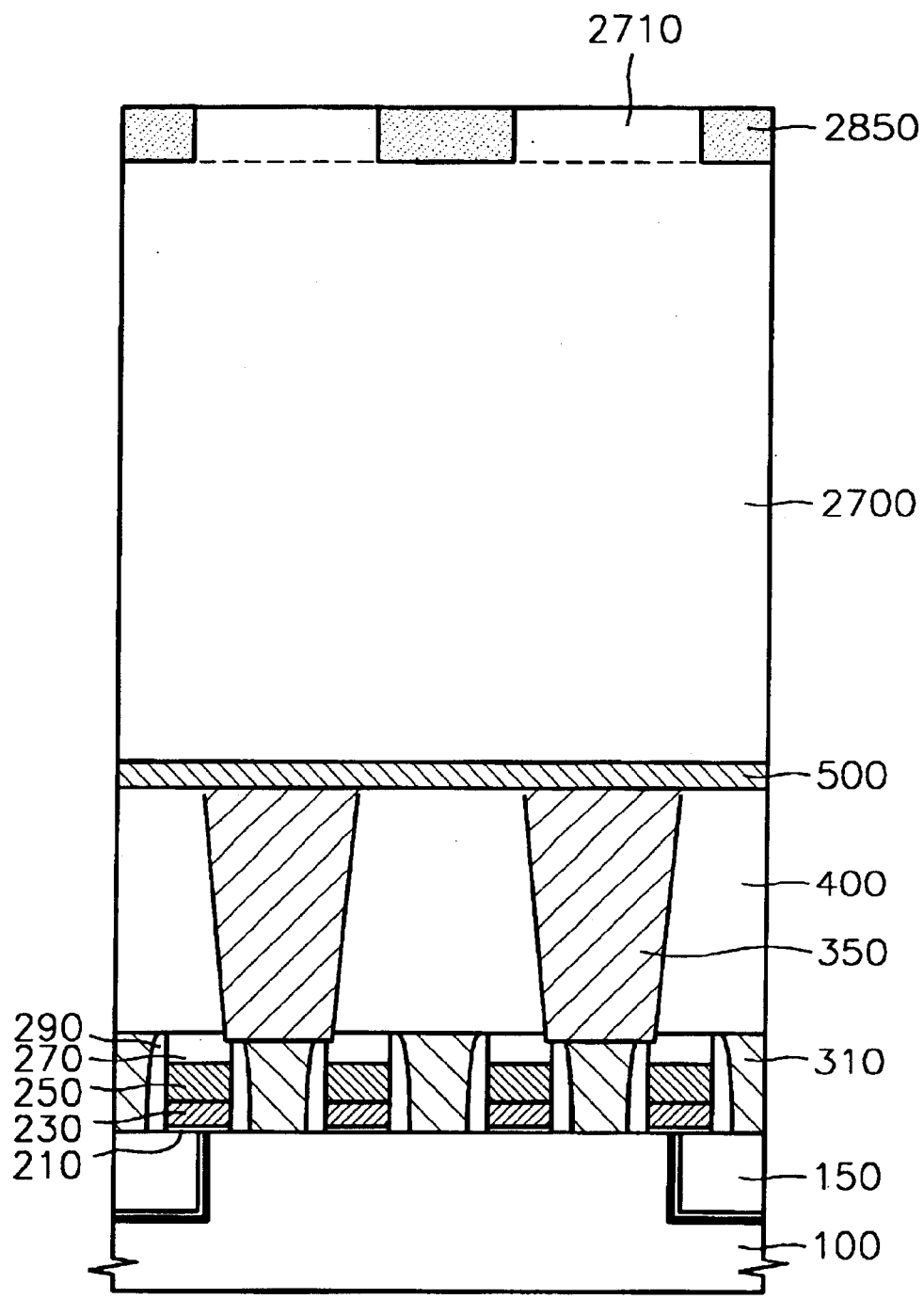

Referring now to FIG. 25 a schematic illustration of forming the hard mask 2850 can be seen. After the photoresist pattern 2800 has been removed, a hard mask layer for filling the groove 2730 is formed. If the mold layer 2700 is formed of silicon oxide, the hard mask layer can be formed of silicon nitride ($Si_3N_4$) for high etch selectivity. The hard mask layer can also be formed of a polycrystalline silicon layer. Further, the hard mask layer can have a thickness of approximately 1500 Å to 2500 Å. Next, the hard mask 2850, which is patterned by planarizing the front surface of the hard mask layer, exposing the top surface of the mold portion 2710, and filling the groove 2730, is formed. Planarization can be conducted by chemical mechanical polishing (CMP) or an etch back.

Figure 26:
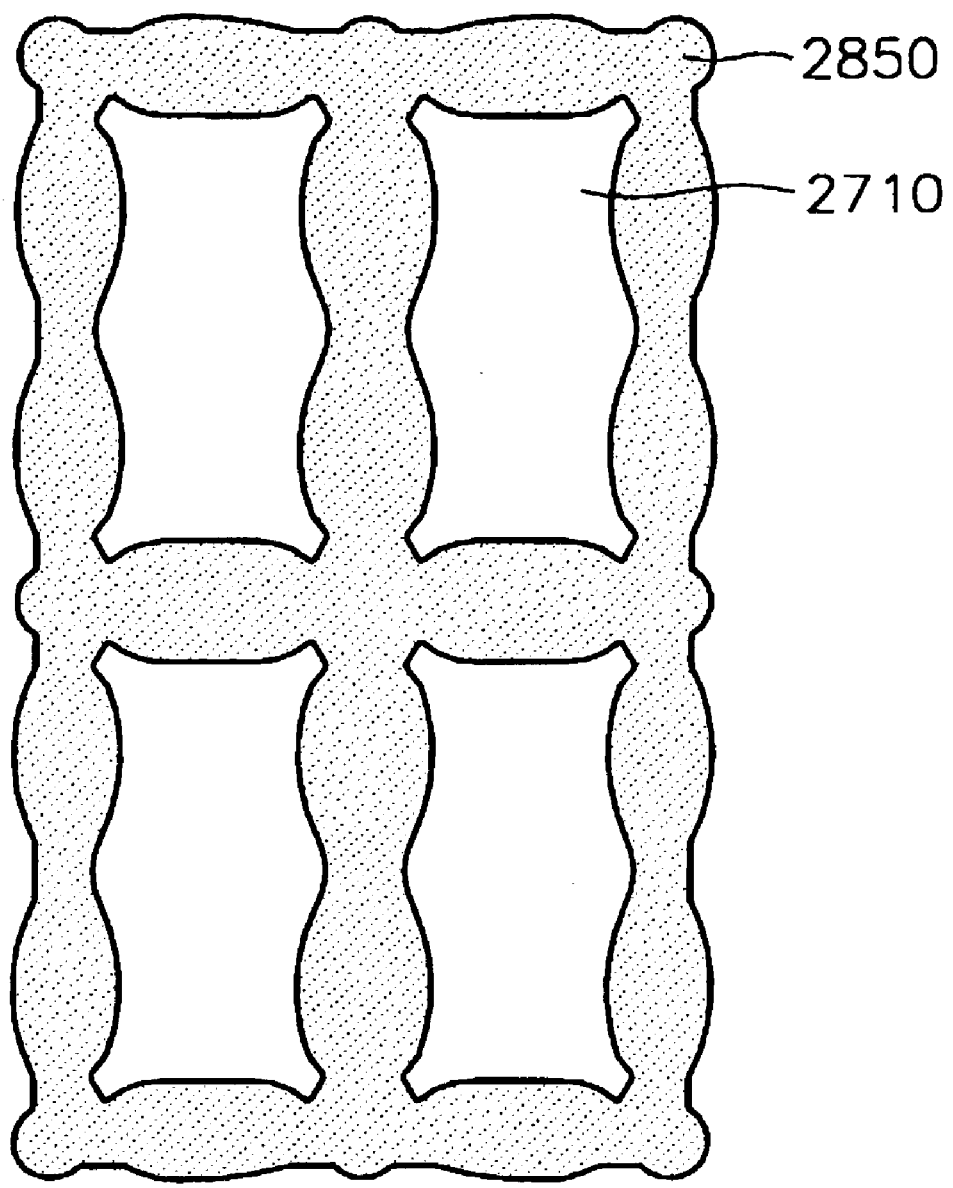

Since the hard mask 2850 formed by the above process includes the portion of the hard mask layer filling the groove 2730, the shape of the hard mask 2850 can be formed in accordance with the groove 2730, as illustrated in FIG. 26. Thus, the hard mask 2850 formed has curved sidewalls.

Figure 27:
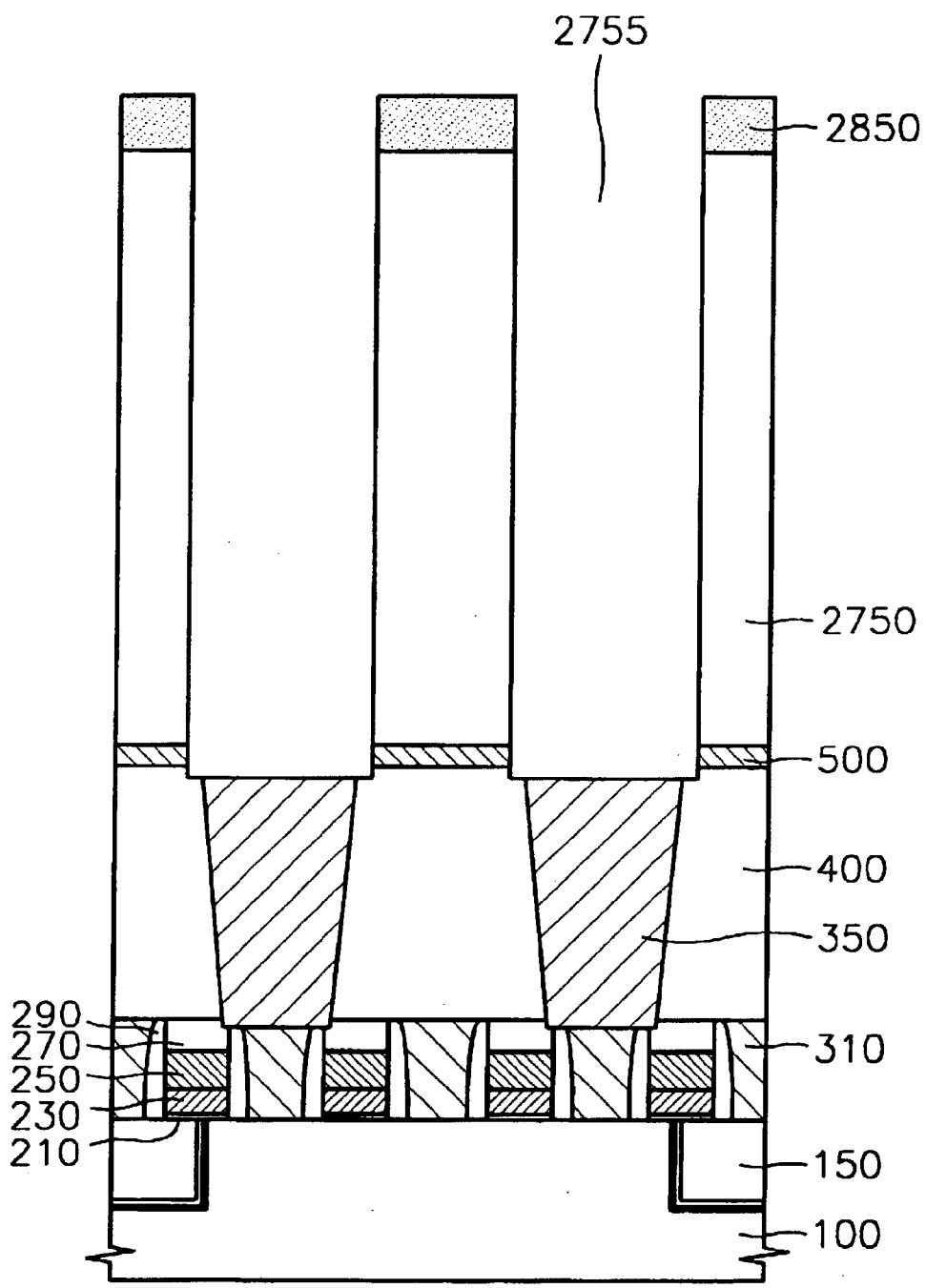

Referring now to FIG. 27, which schematically illustrates forming a mold frame 2750 for the storage node by patterning the mold layer 2700 of FIG. 25 using the hard mask 2850 as an etching mask. For example, the mold frame 2750 for the storage node is formed to give a three-dimensional shape to the storage node by selectively etching the mold portion 2710 and the mold layer 2700 using the hard mask 2850 as an etching mask. The etching is performed by a process that possesses excellent directional characteristics, such as dry etching. The etching can be stopped on the electrode supporter layer 500 positioned under the mold layer 2700. In addition, the mold layer 2700 is etched to expose the upper surface of the lower conductive plug 350.

Figure 28:
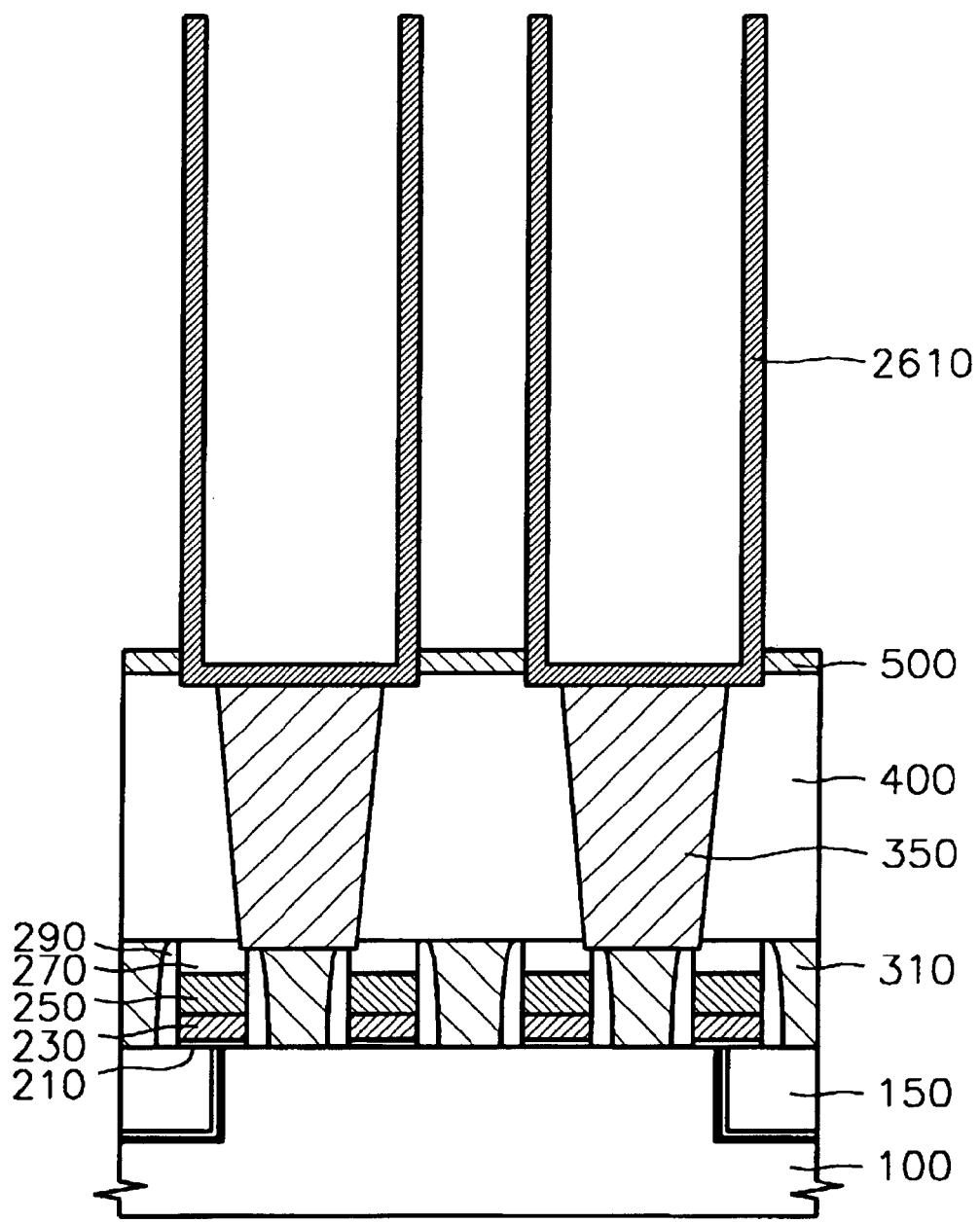
Figure 29:
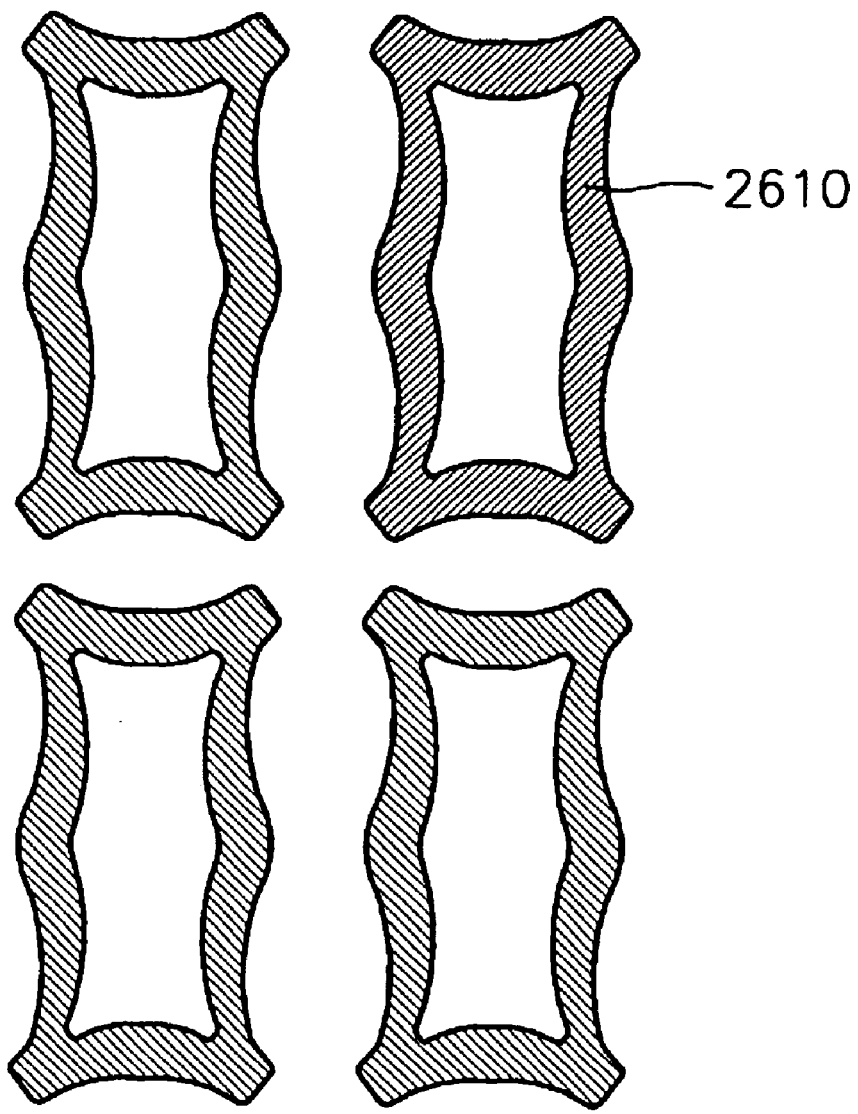

FIG. 28 schematically illustrates the formation of the storage node 2610. FIG. 29 is a schematic illustration of the plane shape of the storage node 2610 shown in FIG. 28. In particular, a thin storage node layer (not shown) is formed along the mold frame 2750 of FIG. 27 to form the storage node 2610. The storage node layer can be formed of a conductive polycrystalline silicon. The storage node layer is formed into an individual storage node 2610 by planarizing the front surface of the storage node layer and exposing the upper surface of the mold frame 2750. The planarization can be performed by chemical mechanical polishing or an etch back. The storage node 2610 is completed by selectively removing the mold frame 2750 for the storage node using a wet strip.

The top plane shape of the opening 2755 of FIG. 27, which is created by the mold frame 2750 for the storage node, is defined by the hard mask 2850 shown in FIG. 26. Accordingly, the contour of the storage node 2610 is the same shape as opening 2755 and conforms to the contour of the hard mask 2850. Therefore, the storage node 2610, as shown in FIG. 29, has curved cylindrical sidewalls defined by the curved sidewalls of the hard mask 2850. Because a storage node 2610 substantially in the shape of a cylinder having curved cylindrical sidewalls can be formed, a capacitor embodied by forming a dielectric layer and a plate node on the storage node 2610 can have an increased capacitance. This increased capacitance occurs because the curved cylindrical sidewalls of the storage node 2610 increases the effective surface area of the storage node.

Figure 30:
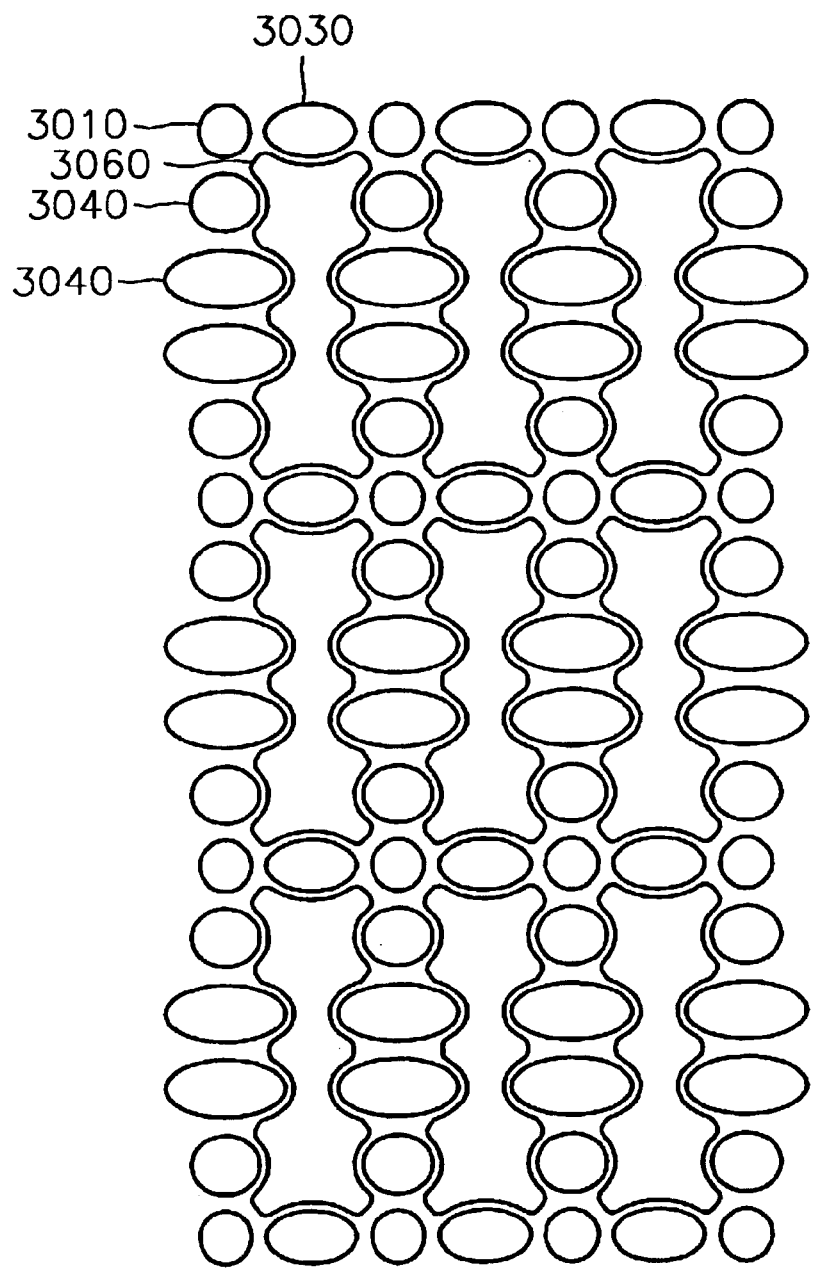
FIGS. 30 and 31 are schematic illustrations of a photomask layout according to other exemplary embodiments of the present invention.
Figure 31:
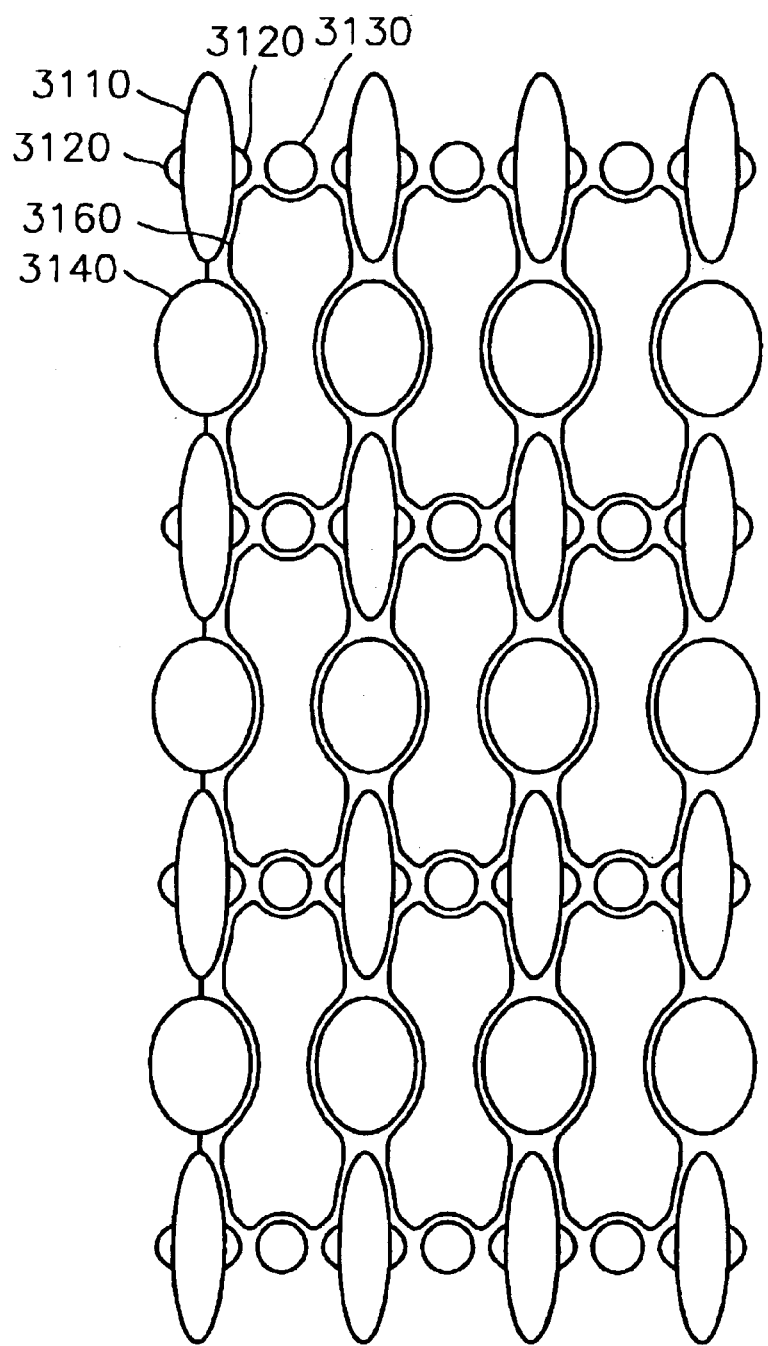

Referring now to FIGS. 30 and 31, other examples of photomasks according to the exemplary embodiments of the present invention can be seen. In particular, the layout of a photomask according to an exemplary embodiment of the present invention can have many different forms. For example, the region where the storage node is formed can be created by arranging light transmitting patterns 3010, 3020, 3030 and 3040 having various shapes, such as circles or ellipses, in the arrangement shown in FIG. 30. As can be seen in FIG. 30, the outlined shape 3060 of the storage node is greatly curved by the array of the light transmitting patterns 3010, 3020, 3030 and 3040. However, it is possible that the light transmitting patterns 3110, 3120, 3130 and 3140 can be formed in a curved shape such as the outlined shape 3060 illustrated in FIG. 31.

In addition, the light transmitting patterns that are separated from each other can be arranged not only outside the region where the storage node is designed but also inside the region. Therefore, it is possible to form a curved storage node pattern that has sharp corners by using various methods, such as the formation of pattern bridges or by a second etching, etc.

According to the exemplary embodiments present invention described above, it is possible to increase the effective surface area of a storage node and to increase the capacitance of a cell capacitor. In addition, electrical shorts can be prevented from occurring between storage nodes that have a cylindrical shape due to its structural effects.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for manufacturing a storage node of a capacitor of a semiconductor device comprising the steps of:

forming a mold layer on a semiconductor substrate;

forming a mold frame for a storage node, said mold frame being formed by introducing a photomask including an array of a plurality of light transmitting patterns separated from each other, said light transmitting patterns defining a region to be occupied by the storage node of the capacitor;

forming the storage node having a shape of the mold frame on the mold; and patterning the mold layer by a photolithography process with the photomask.

2. The method of claim 1, wherein the light transmitting patterns are arranged around the region to be occupied by the storage node and have a substantially rectangular shape.

3. The method of claim 2, wherein the light transmitting patterns are separated from each other by light shielding patterns.

4. The method of claim 1, wherein the light transmitting patterns have shapes and sizes that are different from each other.

5. The method of claim 1, wherein the light transmitting patterns have substantially the same shapes and sizes.

6. The method of claim 1, wherein light transmitting patterns transferred to the mold layer during the photolithography process display pattern bridges and are connected to each other.

7. The method of claim 1, wherein the mold frame has a substantially rectangular opening to be occupied by the storage node.

8. The method of claim 7, wherein the storage node has a substantially rectangular shape.

9. The method of claim 1, wherein the mold frame has an opening having an indented sidewall surface for the region to be occupied by the storage node.

10. The method of claim 9, wherein the storage node has indented sidewalls due to the indented sidewall surface of the opening in the mold.

11. The method of claim 9, wherein the storage node has an indented cylindrical sidewall due to the indented sidewall surface of the mold frame for the storage node.

12. The method of claim 1, wherein the photomask further comprises a medium layer for transmitting light and a light shielding portion selectively formed on the medium layer to selectively shield light transmitted through the light transmitting patterns.

13. The method of claim 12, wherein said medium layer is formed of a quartz substrate and the light transmitting region is formed of chromium.

14. The method of claim 1, wherein the storage node has an increased surface area without increasing the height of the storage node.

15. The method of claim 14, wherein the increased surface area of the storage node increases the capacitance of the semiconductor device.

16. The method of claim 15, wherein the increase in the capacitance of the semiconductor device is from 4–5 pF.

17. A storage node of a capacitor of a semiconductor device formed by the method of claim 1, wherein the storage node has a curved cylindrical sidewall, protruded against the ground.

18. The storage node of claim 17, wherein the indented shape extends over the sidewall of the cylinder in the protruding direction.

19. A method for manufacturing a storage node of a capacitor of a semiconductor device, the method comprising the steps of:
   forming a mold layer on a semiconductor substrate;
   forming a photoresist layer on the mold layer;
   introducing a photomask having a plurality of light transmitting patterns separated from each other and arranged around the region to be occupied by the storage node of the capacitor and a light shielding portion;
   forming a photoresist pattern from the photoresist layer by transferring the layout of the light shielding portion of the photomask by a photolithography process, wherein the light transmitting patterns transferred to the photoresist layer display pattern bridges and are connected to each other;
   forming a mold frame for the storage node by patterning the mold layer with an etching process using the photoresist pattern as an etching mask; and
   forming the storage node having a shape substantially similar to the mold frame.

20. The method of claim 19, wherein the photoresist pattern has intended sidewalls due to the presence of pattern bridges.

21. The method of claim 19, further comprising the steps of:
   forming a groove for a hard mask mold on the surface of the mold layer by etching an exposed portion of the mold layer using the photoresist pattern as an etching mask; and
   forming a hard mask for filling the groove;
   wherein the hard mask is used as an etching mask in forming the mold frame for the storage node.

22. The method of claim 21, wherein the step of forming the groove for the hard mask comprises the steps of:
   dry-etching the portion of the mold layer exposed by the photoresist pattern; and
   performing wet-etching to create the pattern bridges.

23. The method of claim 21, wherein the step of forming the hard mask comprises the steps of:
   forming a hard mask layer for filling the groove; and
   planarizing the hard mask layer until an upper surface of the mold layer is exposed.

24. The method of claim 21, wherein the hard mask has a curved sidewall due to the presence of pattern bridges.

25. The method of claim 21, wherein the hard mask is formed of a member selected from the group consisting of silicon nitride and polycrystalline silicon.

26. The method of claim 21, wherein the light transmitting patterns have sizes and shapes that are different from each other.

27. The method of claim 21, wherein the light transmitting patterns have substantially the same sizes and shapes.

28. The method of claim 21, wherein the photomask further comprises a medium layer for transmitting light and a light shielding portion selectively formed on the medium layer to selectively shield light transmitted through the light transmitting patterns.

29. The method of claim 28, wherein said medium layer is formed of a quartz substrate and the light transmitting region is formed of chromium.

30. The method of claim 19, wherein the storage node has an increased surface area without increasing the height of the storage node.

31. The method of claim 30, wherein the increased surface area of the storage node increases the capacitance of the semiconductor device.

32. The method of claim 31, wherein the increase in the capacitance of the semiconductor device from 4–5 pF.

33. The method of claim 19, wherein at least a portion of the light transmitting regions are substantially elliptical.

34. The method of claim 33, wherein said substantially elliptical light transmitting regions have a long axis and a short axis, said substantially elliptical light transmitting regions being located around a region to be located by said storage node such that the long axis is parallel to the shape of the storage node.

35. The method of claim 34, wherein said mold frame has undulated sidewalls due to said substantially elliptical light transmitting regions.

36. The method of claim 35, wherein said storage node has substantially rectangular undulated sidewalls.

37. The method of claim 33, wherein said substantially elliptical light transmitting regions have a long axis and a short axis, said substantially elliptical light transmitting regions being located around a region to be located by the storage node such that the short axis is parallel to the shape of the storage node.

38. The method of claim 37, wherein said mold frame has undulated sidewalls due to said substantially elliptical light transmitting regions.

39. The method of claim 38, wherein said storage node has undulated sidewalls.

40. A method for manufacturing a storage node of a capacitor for a semiconductor device comprising the steps of:
   forming a mold layer on a semiconductor substrate;
   forming a photoresist layer on the mold layer;
   forming a photoresist pattern by transferring shapes of light transmitting patterns to the mold layer by introducing a photomask on which a plurality of the light transmitting patterns which are separated from each other are arranged around a region to be occupied by the storage node;
   forming a first groove by dry etching the portion of a mold layer for the storage node exposed by the photoresist pattern;
   forming a second groove to by a second etching using the photoresist pattern as an etching mask to form pattern bridges;
   forming a mold frame for the storage node by patterning the mold layer so that the shapes of the light transmitting patterns are transferred to the mold layer for the storage node; and
   forming a storage node having a shape substantially similar to the mold frame.

41. The method of claim 40, wherein the second etching is a wet etching.

42. The method of claim 41, wherein said mold frame has indented sidewalls due to said substantially elliptical light transmitting regions.

43. The method of claim 42, wherein said storage node has substantially rectangular indented sidewalls.

44. The method of claim 40, wherein sidewalls of the second groove are curved as a result of the pattern bridges.

45. The method of claim 40, wherein the photoresist pattern creates opening holes having substantially the same shape and arranged in substantially manner as the light transmitting patterns.

46. The method of claim 40, wherein the step of forming the mold frame for the storage node comprises the steps of:

removing the photoresist pattern;

forming a hard mask layer for filling the first and second grooves;

forming a hard mask by planarizing a front surface of the hard mask layer and exposing a surface of the mold layer; and selectively etching the mold layer to form the mold frame for the storage node using the hard mask as an etching mask.

47. The method of claim 46, wherein the hard mask has curved sidewalls caused by the pattern bridges.

48. The method of claim 46, wherein the storage node has curved sidewalls due to the curved sidewalls of the hard mask.

49. The method of claim 46, wherein the mold layer is formed of silicon oxide and the hard mask layer is formed of silicon nitride or polycrystalline silicon.

50. The method of claim 46, wherein the storage node has an increased surface area without increasing the height of the storage node.

51. The method of claim 50, wherein the increased surface area of the storage node increases the capacitance of the semiconductor device.

52. The method of claim 51, wherein the increase in the capacitance of the semiconductor device is from 4–5 pF.

53. The method of claim 40, wherein the photomask further comprises a medium layer for transmitting light and a light shielding portion selectively formed on the medium layer to selectively shield light transmitted through the light transmitting patterns.

54. The method of claim 40, wherein the light transmitting patterns have sizes and shapes that are different from each other.

55. The method of claim 40, wherein the light transmitting patterns have substantially the same sizes and shapes.

56. The method of claim 40, wherein the light transmitting patterns are formed substantially in the shape of a circle or substantially in the shape of an ellipse.

57. The method of claim 56, wherein the step of forming the storage node comprises the steps of:

forming a storage node layer on the mold frame;

selectively etching the mold frame.

58. The method of claim 57, wherein the mold frame is selectively etched using a wet strip.

59. The method of claim 40, wherein said first groove has a substantially elliptical shape.

60. The method of claim 59, wherein said first groove has a long axis and a short axis, said first groove being located around a region to be located by said storage node such that the long axis is parallel to the shape of the storage node.

61. The method of claim 60, wherein said storage node has indented sidewalls.

* * * * *